(12) United States Patent
    Okita

(10) Patent No.: US 10,818,553 B2
(45) Date of Patent: Oct. 27, 2020

(54) METHOD FOR CUTTING ELEMENT CHIP BY LASER SCRIBING

(71) Applicant: Panasonic Intellectual Property Management Co., Ltd., Osaka (JP)

(72) Inventor: Shogo Okita, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/280,160

(22) Filed: Feb. 20, 2019

(65) Prior Publication Data
    US 2019/0295894 A1    Sep. 26, 2019

(30) Foreign Application Priority Data

Mar. 26, 2018 (JP) .................. 2018-058558
Mar. 26, 2018 (JP) .................. 2018-058561

(51) Int. Cl.
    *H01L 21/78*    (2006.01)
    *H01L 21/683*   (2006.01)
    (Continued)

(52) U.S. Cl.
    CPC ........ *H01L 21/78* (2013.01); *H01L 21/02076* (2013.01); *H01L 21/268* (2013.01);
    (Continued)

(58) Field of Classification Search
    CPC ..... H01L 21/78; H01L 21/82; H01L 21/3065; H01L 22/10; H01L 22/12; H01L 22/20; H01L 2221/683; H01L 2221/68327; H01L 2221/68381; H01L 2221/68354; H01L 21/782; H01L 2221/6834; H01L 21/308–3086; H01L 21/31138;
    (Continued)

(56) References Cited

U.S. PATENT DOCUMENTS 9,953,906 B2 *   4/2018  Harikai ............... H01L 21/78
2010/0055875 A1  3/2010  Haji et al.
                 (Continued)

FOREIGN PATENT DOCUMENTS

JP    5023614 B2      9/2012
JP    2017-515316 A   6/2017
WO    2015/134111 A1  9/2015

*Primary Examiner* — Sonya McCall-Shepard
(74) *Attorney, Agent, or Firm* — Pearne & Gordon LLP

(57) ABSTRACT

The method for manufacturing an element chip includes: sticking an adhesive tape having translucency to a front surface of a semiconductor wafer; measuring a position and a width of a second close contact portion in a dividing region; applying a laser beam having a beam diameter smaller than the width of the second close contact portion to the adhesive tape such that the laser beam does not protrude from the second close contact portion based on the width of the second close contact portion and the beam diameter, and forming an exposed portion; exposing the front surface to plasma with a back surface held by a dicing tape, and while protecting an element region from the plasma with an adhesive tape, etching the dividing region exposed in the exposed portion to dice the substrate into a plurality of element chips; and removing the adhesive tape remaining on the front surface.

4 Claims, 18 Drawing Sheets

(51) Int. Cl.
*H01L 21/66* (2006.01)
*H01L 21/268* (2006.01)
*H01L 21/3065* (2006.01)
*H01L 21/02* (2006.01)
*H01L 21/3213* (2006.01)
*H01L 21/311* (2006.01)
*H01L 21/82* (2006.01)
*H01L 21/308* (2006.01)
*H01L 21/782* (2006.01)
*H01L 21/67* (2006.01)

(52) U.S. Cl.
CPC ...... *H01L 21/3065* (2013.01); *H01L 21/6836* (2013.01); *H01L 22/20* (2013.01); *H01J 2237/32* (2013.01); *H01L 21/02071* (2013.01); *H01L 21/308* (2013.01); *H01L 21/31138* (2013.01); *H01L 21/32136* (2013.01); *H01L 21/67069* (2013.01); *H01L 21/67115* (2013.01); *H01L 21/67167* (2013.01); *H01L 21/67207* (2013.01); *H01L 21/782* (2013.01); *H01L 21/82* (2013.01); *H01L 2221/6834* (2013.01); *H01L 2221/68327* (2013.01); *H01L 2221/68381* (2013.01)

(58) Field of Classification Search
CPC .......... H01L 21/32136; H01L 21/02071; H01J 2237/32–3347
See application file for complete search history.

(56) References Cited

U.S. PATENT DOCUMENTS

2011/0008552 A1* 1/2011 Umemoto .................. C09J 7/38
428/1.5
2018/0226359 A1* 8/2018 Yokoi .................. H01L 21/304

* cited by examiner

METHOD FOR CUTTING ELEMENT CHIP BY LASER SCRIBING

BACKGROUND OF THE INVENTION

Field of the Invention

The present invention relates to a method for manufacturing an element chip.

Description of Related Art

Plasma etching may be used to manufacture element chips. Plasma etching is widely used, and for example, a method referred to as plasma dicing for dicing a substrate is known as one of them. In the plasma dicing of a substrate including a plurality of element regions defined by dividing regions, the dividing region is plasma etched from one side up to the other side of the substrate, and the substrate is diced into each element chip. In such plasma dicing, only the dividing region needs to be plasma etched, that is, the element regions need to be protected from plasma. Therefore, in general, before plasma etching, a mask having plasma resistance is formed on the front surface of the element region. This mask is removed by ashing or the like after plasma dicing.

Depending on the type of the element chip, an evaluation device referred to as test element group (TEG) may be formed in the dividing region. In the element chip manufacturing steps, various characteristic investigations are performed by using this TEG, and actual device characteristics are monitored. Since TEG is generally made of a material containing a metal or an inorganic material, TEG may disturb the plasma dicing. Therefore, this case may include after cutting the dividing region by laser scribing to a certain extent to remove TEG, plasma dicing the remaining portion. A method for manufacturing an element chip including such laser scribing and plasma dicing is disclosed in, for example, Japanese Patent No. 5023614. Japanese Patent No. 5023614 discloses, as a method for forming a mask, a method of sticking a resin formed in a film shape or a method of applying a liquid resin by spin coating. The method of sticking a resin formed in a film shape has advantages of capable of being performed and the like with comparatively simple equipment, as compared with the method of applying a liquid resin by spin coating.

SUMMARY OF THE INVENTION

When laser scribing is performed, cutting debris referred to as debris is generated. Normally, laser scribing is performed from above the mask as described in Japanese Patent No. 5023614, so that debris is prevented from sticking to the front surface of the substrate. However, since the front surface of the element chip has various uneven portions such as electrodes, when a resin formed in a film shape is to be stuck as a mask, it is difficult to stick the mask completely along the uneven portions. Therefore, a gap may be partially generated between the front surface of the substrate and the mask. In particular, when the gap is generated in the dividing region to be laser scribed, debris may enter the mask from the gap and stick to the front surface of the substrate. Debris excessively sticking to the front surface of the substrate results in a defective product as an element chip.

It is an object of the present invention to prevent debris from sticking to the front surface of the substrate when laser scribing is performed in a method for manufacturing an element chip.

A first aspect of the present invention provides a method for manufacturing an element chip, the method including: preparing a substrate including a first surface and a second surface on an opposite side of the first surface, the substrate including on the first surface a plurality of element regions each including an electrode, and a dividing region configured to define each of the plurality of element regions, the dividing region is lower in height smaller than each of the element regions; sticking an adhesive tape having translucency to a side of the first surface of the substrate, and pressing the adhesive tape against the substrate to form a first close contact portion in which the substrate and the adhesive tape are in close contact with each other in each of the plurality of element regions, and a second close contact portion in which the substrate and the adhesive tape are in close contact with each other along the dividing region in the dividing region; measuring a position and a width of the second close contact portion in the dividing region; applying a laser beam having a beam diameter smaller than the width of the second close contact portion to the adhesive tape such that the laser beam does not protrude from the second close contact portion based on the width of the second close contact portion and the beam diameter, and forming an exposed portion configured to expose the dividing region of the substrate to the adhesive tape; exposing the first surface of the substrate to plasma with the second surface of the substrate held by a holding member, and while protecting each of the plurality of element regions from the plasma with the adhesive tape, etching the dividing region exposed in the exposed portion until the second surface is reached to dice the substrate into a plurality of element chips; and removing the adhesive tape remaining on the first surface of the substrate diced.

According to the method, on the front surface (first surface) of the dividing region to be cut by laser scribing, it can be checked that the second close contact portion is formed to have a size that allows laser scribing. Specifically, since a translucent adhesive tape is used as the mask, it can be easily determined by image recognition or the like whether the adhesive tape sticks to the front surface of the substrate. Thus, the position and width of the second close contact portion can be easily detected. Therefore, in consideration of the width and the preset beam diameter, the second close contact portion can be laser-scribed accurately. As a result, since the laser scribing is performed with the adhesive tape completely in close contact, it is possible to prevent debris from entering between the adhesive tape and the substrate and sticking to the front surface of the substrate.

In the method for manufacturing an element chip, further may comprise: determining whether to perform the applying of the laser beam, wherein the applying of the laser beam is performed when the width of the second close contact portion is larger than the beam diameter of the laser beam, and the applying of the laser beam is not performed when the width of the second close contact portion is equal to the beam diameter or smaller than the beam diameter of the laser beam.

According to the method, the laser scribing is performed only when the width of the second close contact portion is equal to or smaller than the beam diameter of the laser beam. If the laser scribing is performed in other cases, laser scribing is performed in a region other than the second close contact portion, that is, laser scribing is performed in a region where the adhesive tape is not in close contact. Then, a region not covered with the adhesive tape appears, and there is a possibility of allowing debris to enter the adhesive tape. Therefore, in that case, the laser beam is not applied, and debris is prevented from sticking to the front surface of the substrate.

A second aspect of the present invention provides a method for manufacturing an element chip, the method including: preparing a substrate including a first surface and a second surface on an opposite side of the first surface, the substrate including on the first surface a plurality of element regions each including an electrode, and a dividing region configured to define each of the plurality of element regions, the dividing region having a height smaller than a height of each of the element regions; applying a resin to the dividing region on a side of the first surface of the substrate to reduce a level difference between each of the plurality of element regions and the dividing region; sticking an adhesive tape to the side of the first surface of the substrate; applying a laser beam to the dividing region, and forming an exposed portion configured to expose the dividing region of the substrate to the adhesive tape; exposing the first surface of the substrate to plasma with the second surface of the substrate held by a holding member, and while protecting each of the plurality of element regions from the plasma with the adhesive tape, etching the dividing region exposed in the exposed portion until the second surface is reached to dice the substrate into a plurality of element chips; and removing the adhesive tape remaining on the first surface of the substrate diced.

According to the method, applying the resin to the dividing region before laser scribing is performed allows the level difference between the element region and the dividing region to be reduced. In the substrate, since the height of the dividing region is smaller than the height of the element region, filling the dividing region having a smaller height with the resin reduces the level difference. Reducing the level difference allows the area where the adhesive tape is in close contact with the substrate when the adhesive tape is stuck to the substrate to be increased. As a result, since the adhesive tape can be laser scribed in a state of being in close contact with the substrate, debris can be prevented from sticking to the front surface of the substrate.

The resin may have water solubility.

According to this method, even when the resin is thick, the resin can be easily removed by water washing after the substrate is diced into a plurality of element chips. In addition, when the resin is removed by water washing with the adhesive tape stuck to the substrate via the resin, the adhesive tape can be removed together with the resin by water washing.

The adhesive tape may have water solubility.

According to this method, the adhesive tape can be easily removed by water washing after the substrate is diced into a plurality of element chips.

According to the present invention, debris can be prevented from sticking to the front surface of the substrate when laser scribing is performed in a method for manufacturing an element chip.

DETAILED DESCRIPTION OF THE PREFERRED EMBODIMENT

In the following, embodiments of the present invention will be described with reference to the accompanying drawings. The dimensions of each part in the accompanying drawings are schematically shown and may differ from the actual dimensions.

First Embodiment

Figure 1A:
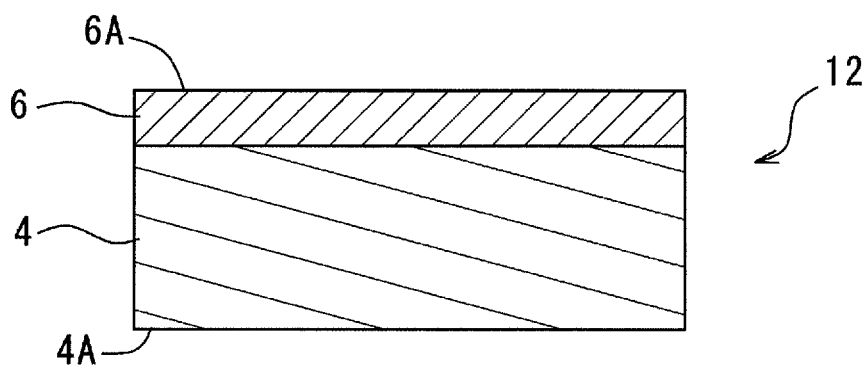
FIG. 1A is a cross-sectional view showing a first preparation step in a method for manufacturing an element chip according to a first embodiment.
Figure 1B:
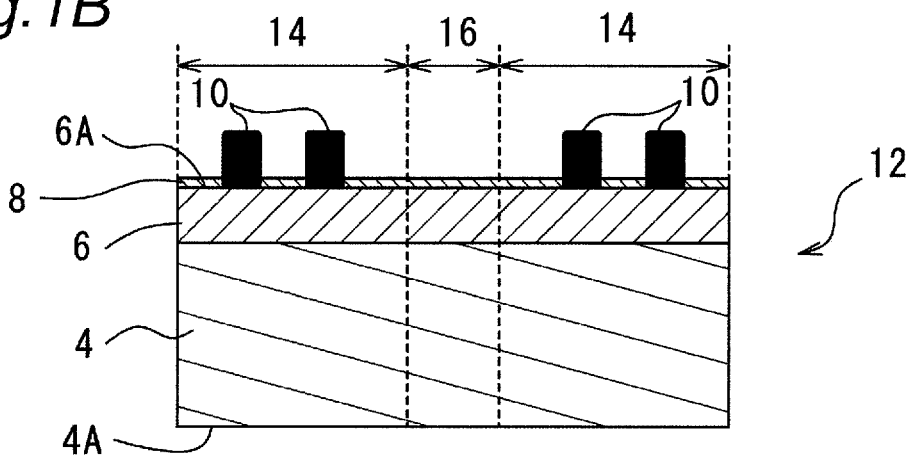
FIG. 1B is a cross-sectional view showing a second preparation step in the method for manufacturing an element chip according to the first embodiment.
Figure 1C:
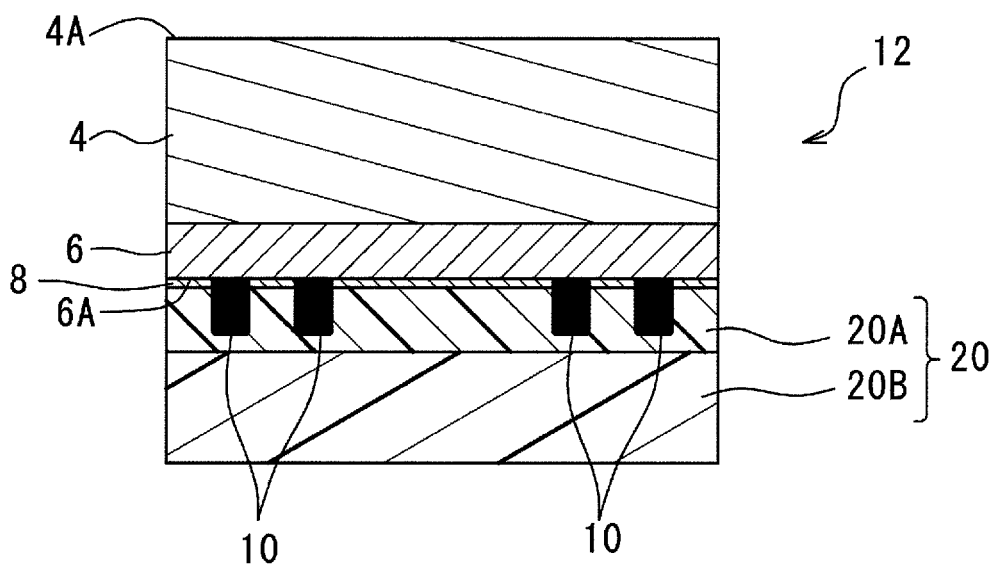
FIG. 1C is a cross-sectional view showing a protection step in the method for manufacturing an element chip according to the first embodiment.
Figure 1D:
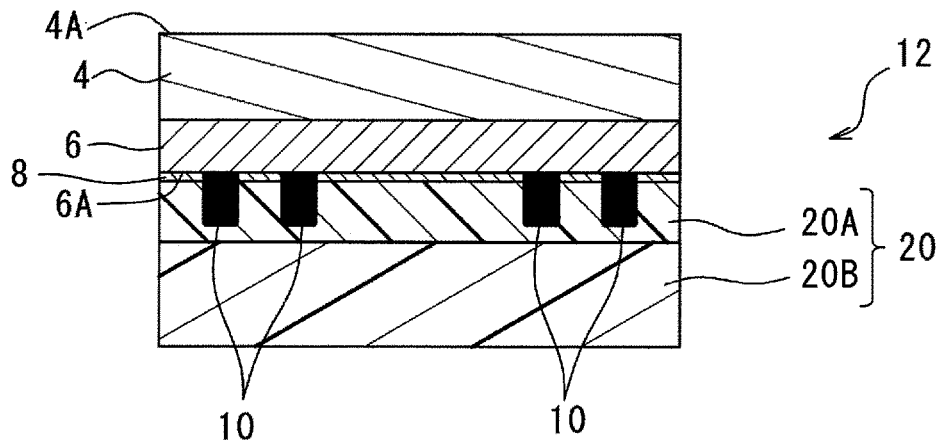
FIG. 1D is a cross-sectional view showing a thinning step in the method for manufacturing an element chip according to the first embodiment.
Figure 1E:
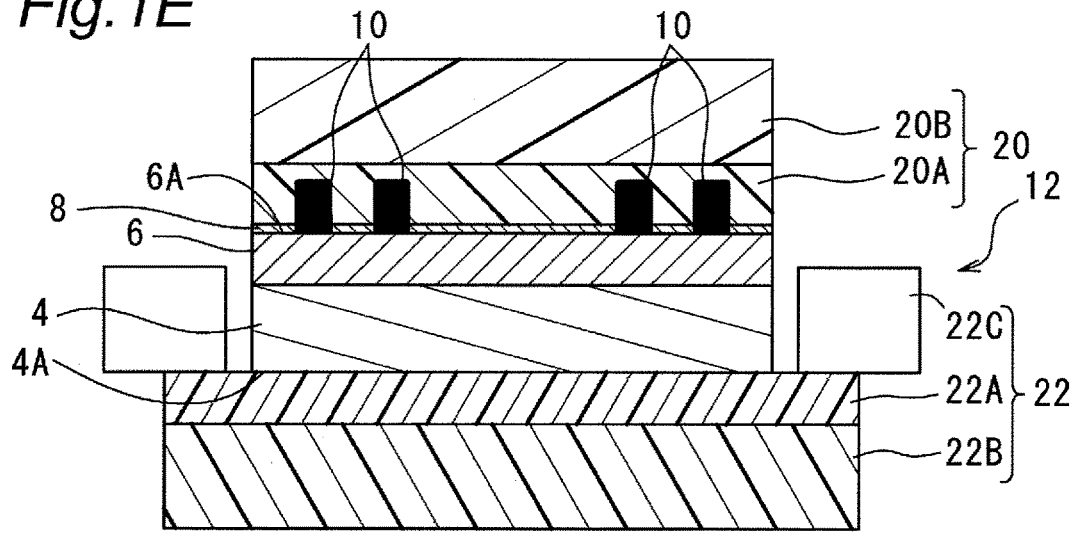
FIG. 1E is a cross-sectional view showing a first holding step in the method for manufacturing an element chip according to the first embodiment.
Figure 1F:
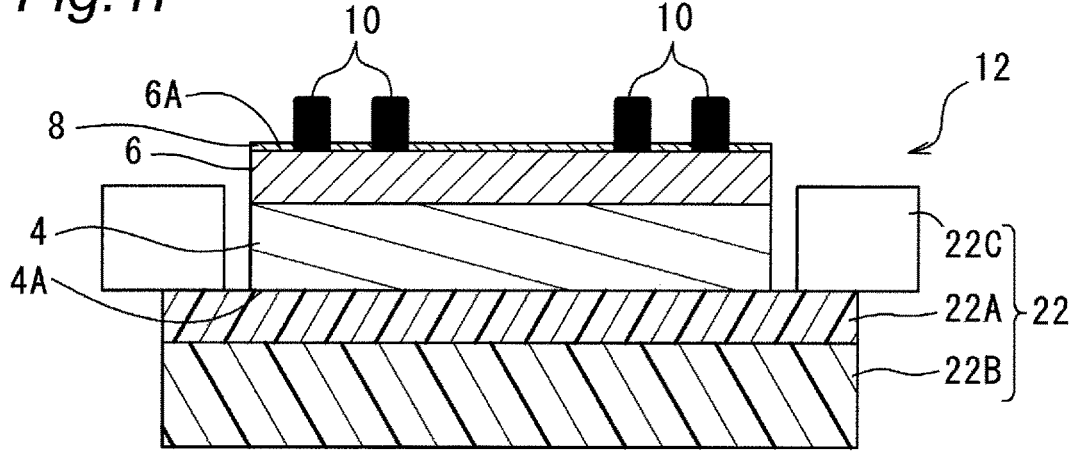
FIG. 1F is across-sectional view showing a second holding step in the method for manufacturing an element chip according to the first embodiment.
Figure 1G:
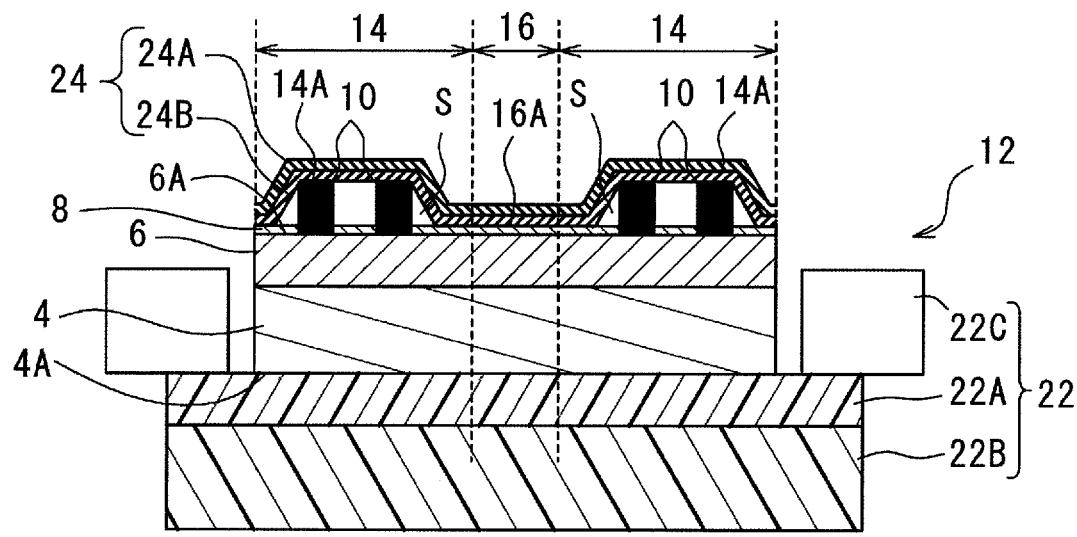
FIG. 1G is a cross-sectional view showing a mask forming step in the method for manufacturing an element chip according to the first embodiment.
Figure 1H:
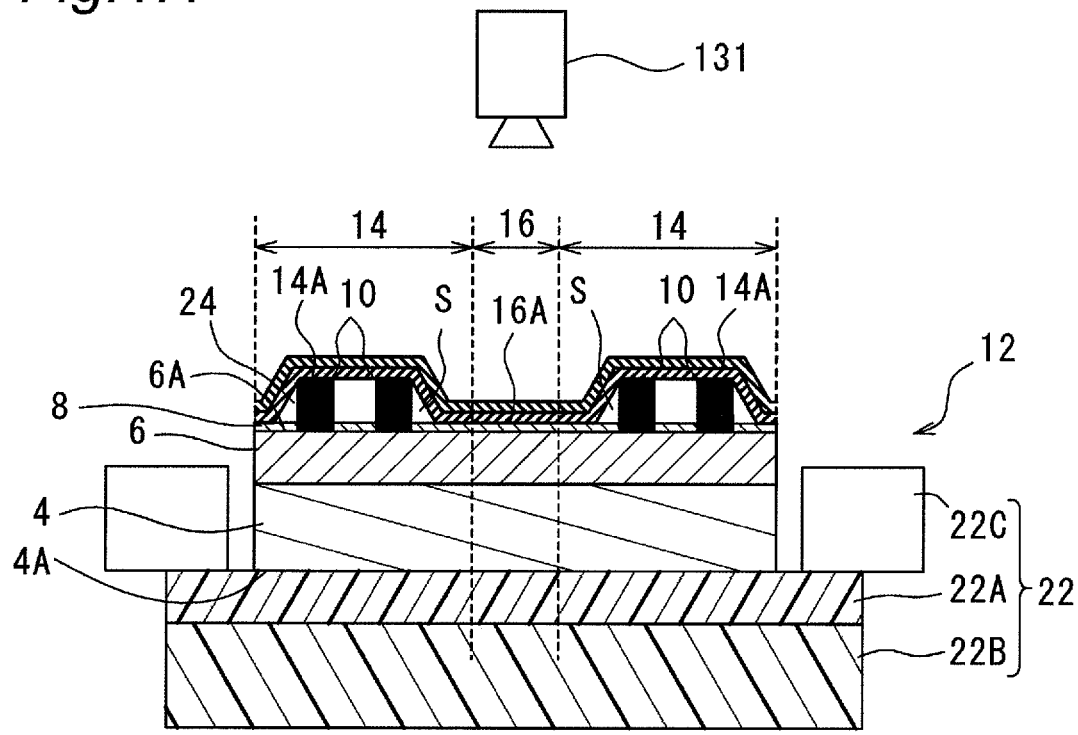
FIG. 1H is a cross-sectional view showing a measuring step in the method for manufacturing an element chip according to the first embodiment.
Figure 1I:
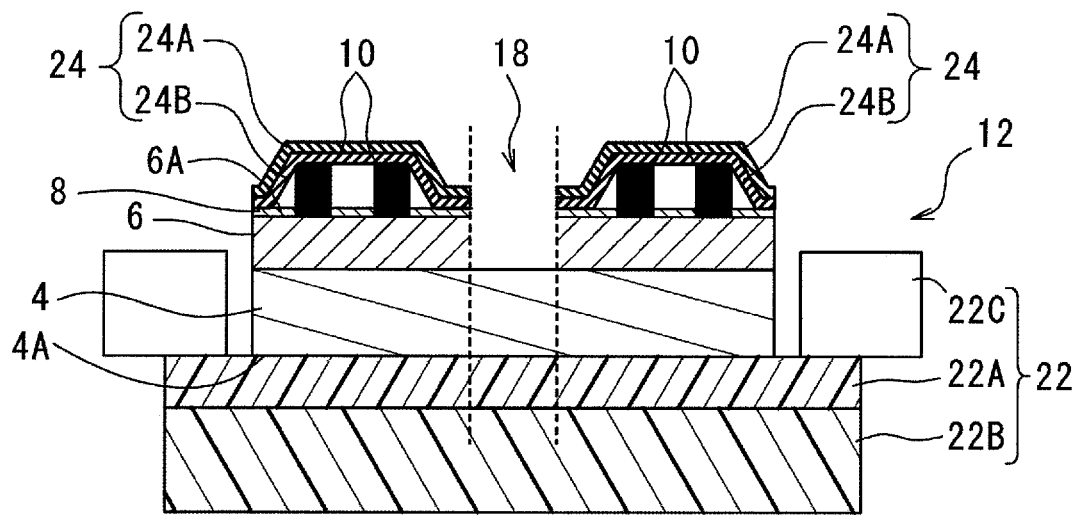
FIG. 1I is a cross-sectional view showing a laser scribing step in the method for manufacturing an element chip according to the first embodiment.
Figure 1J:
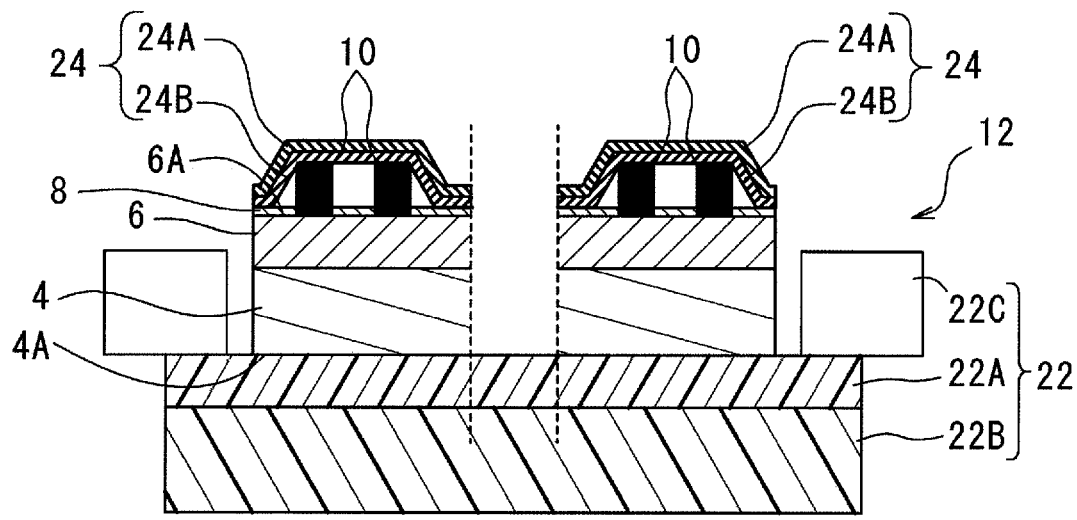
FIG. 1J is a cross-sectional view showing a dicing step in the method for manufacturing an element chip according to the first embodiment.
Figure 1K:
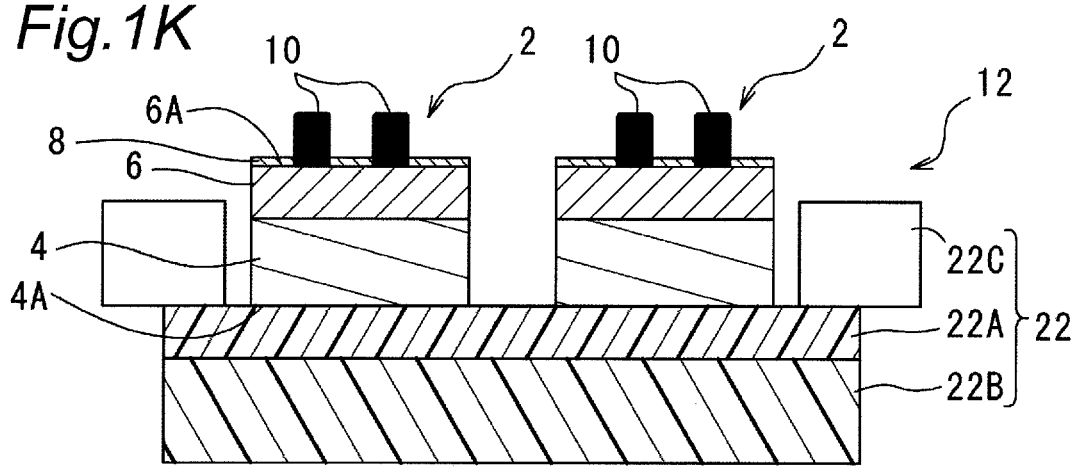
FIG. 1K is a cross-sectional view showing a mask removing step in the method for manufacturing an element chip according to the first embodiment.

FIGS. 1A to 1K show manufacturing steps of a semiconductor chip (element chip) 2 according to the first embodiment of the present invention. Referring to FIG. 1K being a completed drawing, the manufactured semiconductor chip 2 includes a semiconductor layer 4, a wiring layer 6 formed on the semiconductor layer 4, a protective film 8 formed on the wiring layer 6, and bumps 10 as electrodes. The semiconductor layer 4 is made of, for example, Si or a Si-based material, and the wiring layer 6 is made of, for example, an insulating film such as $SiO_2$ and metal such as Cu. The material of the insulating film of the wiring layer 6 may be SiN, SiOC, Low-k material, or the like. In addition, the material of the metal of the wiring layer 6 may be Al, Al alloy, W, or the like. In addition, TEG is also included in the wiring layer 6. In addition, the metal contained in the bump 10 may be copper; an alloy of copper, tin, and silver; an alloy of silver and tin; an alloy of lead and tin; gold; aluminum; an aluminum alloy; or the like. The shape of the bump 10 is not particularly limited, and may be a prism, a cylinder, a mountain, a ball, or the like. The arrangement and the number of the bumps 10 are not particularly limited, and are appropriately set according to the purpose.

In a first preparation step shown in FIG. 1A, a semiconductor wafer (substrate) 12 is prepared. As shown in FIG. 1A, the semiconductor wafer 12 includes the semiconductor layer 4 and the wiring layer 6 formed on the semiconductor layer 4. The thickness of the semiconductor layer 4 is, for example, 5 µm. The thickness of the wiring layer 6 is, for example, 50 µm.

In a second preparation step shown in FIG. 1B, the protective film 8 and the bumps 10 are formed on a front surface (first surface) 6A of the wiring layer 6 of the semiconductor wafer 12. The height of the bump 10 is, for example, 50 µm. The semiconductor wafer 12 through this step includes a plurality of element regions 14 in which the bumps 10 are formed and a dividing region 16 adjacent to the periphery of the individual element regions 14. In other words, the individual element regions 14 are defined with the dividing regions 16.

Comparing the height of element region 14 with the height of dividing region 16 shows the height of dividing region 16 being lower due to the bumps 10 formed. In the present embodiment, such a height difference is caused by the bumps 10, but various factors other than the bump 10 are also considered to cause the height difference, and for example, a height difference may also occur due to other mounted components mounted on the front surface of the semiconductor wafer 12. In addition, when the semiconductor wafer 12 includes a CMOS image sensor or an MEMS element, a height difference may also occur due to a lens included in the CMOS image sensor or a structure included in the MEMS element. Even when height differences are caused by other mounted components other than the bumps 10, lenses, and structures, the semiconductor wafer 12 only has to have a shape in which the height of the dividing region 16 is lower than the height of the element region 14. In addition, if the semiconductor wafer 12 has a shape in which the height of the dividing region 16 is lower than the height of the element region 14, the form of the electrode is not limited to a protruding shape like the bump 10 and may be a recessed shape like a pad.

In the protection step shown in FIG. 1C, a BG (back grind) tape 20 for protecting a back surface 4A during grinding is stuck to the front surface 6A of the semiconductor wafer 12. It should be noted that FIG. 1C is shown upside down with respect to FIGS. 1A and 1B. The BG tape 20 is a protective film including an adhesive layer 20A and a resin base material layer 20B. That is, the adhesive layer 20A is stuck to the front surface 6A of the semiconductor wafer 12, and the front surface 6A of the semiconductor wafer 12 is protected with the base material layer 20B. Since the BG tape 20 is cut in accordance with the outer shape of the semiconductor wafer 12 after being stuck or before being stuck to the semiconductor wafer 12, the handleability of the semiconductor wafer 12 is not impaired.

In the thinning step shown in FIG. 1D, the semiconductor layer 4 is ground from the back surface (second surface) 4A side of the semiconductor wafer 12 by a grinding device (not shown). The semiconductor wafer 12 is thinned to a predetermined thickness by the semiconductor layer 4 being ground.

In the first holding step shown in FIG. 1E, a dicing tape (holding member) 22 is stuck to the back surface 4A of the semiconductor wafer 12. It should be noted that FIG. 1E is shown upside down with respect to FIGS. 1C and 1D. The dicing tape 22 is a holding film made of an adhesive layer 22A and a resin base material layer 22B. The adhesive layer 22A is stuck to the back surface 4A of the semiconductor wafer 12, and the semiconductor wafer 12 is held with the base material layer 22B. In addition, a frame 22C is attached to the dicing tape 22 from the viewpoint of handleability.

In the second holding step shown in FIG. 1F, the BG tape 20 is peeled off from the semiconductor wafer 12 to be removed. In a state where the BG tape 20 is removed, the bumps 10 are exposed at the front surface 6A of the semiconductor wafer 12.

In the mask forming step shown in FIG. 1G, an adhesive tape 24 having translucency is pressed against the front surface 6A of the semiconductor wafer 12 to be stuck. The thickness of the adhesive tape 24 is about 5 to 50 μm, and in the present embodiment, for example, 20 μm. The adhesive tape 24 has a two-layer structure including a base material layer 24A as a base and an adhesive layer 24B to be stuck to the semiconductor wafer 12. In the present embodiment, both the base material layer 24A and the adhesive layer 24B are transparent, and seeing through the adhesive tape 24 allows the portion where the adhesive tape 24 is stuck to be checked. In addition, the adhesive tape 24 (in particular, the base material layer 24A) has plasma resistance. Therefore, the portion to which the adhesive tape 24 is stuck of the semiconductor wafer 12 is protected from the subsequent plasma etching. That is, the adhesive tape 24 functions as a mask against the plasma. Hereinafter, the portion to which the adhesive tape 24 is stuck in the element region 14 (more precisely, the portion in close contact therewith) is also referred to as a first close contact portion 14A, and the portion to which the adhesive tape 24 is stuck in the dividing region 16 (more precisely, the portion in close contact therewith) is also referred to as a second close contact portion 16A.

In a state where the adhesive tape 24 is stuck, a gap S is generated between the periphery of the bump 10 and the adhesive tape 24. In the illustrated example, the gap S is generated due to the height difference caused by the bump 10 protruding from the front surface 6A of the semiconductor wafer 12, but as described above, the factors of forming the height difference are variously considered other than the bump 10, and for example, the height difference may also be formed by other mounted components mounted on the front surface of the semiconductor wafer 12. In addition, when the semiconductor wafer 12 includes a CMOS image sensor or an MEMS element, a height difference may also be formed due to a lens included in the CMOS image sensor or a structure included in the MEMS element. Therefore, actually, as illustrated, not only in the periphery of the bump 10 but also in various modes, the gap S may occur.

The smaller the gap S is, the more preferable it is, and the gap S does not affect the subsequent step. Therefore, after sticking the adhesive tape 24, further pressing only the dividing region 16, or using a thermoplastic adhesive tape 24, softening the adhesive tape 24 by applying heat, and then pressing the adhesive tape 24 allows the gap S to be reduced. In addition, after sticking the adhesive tape 24, putting the semiconductor wafer 12 into a vacuum chamber to reduce the pressure stepwise allows the air in the gap S to be exhausted, the gap S to be reduced, and the gap S to be decreased.

In the measuring step shown in FIG. 1H, in the dividing region 16, the position and the width of the portion to which the adhesive tape 24 is stuck (second close contact portion) 16A are measured. The measurement is performed based on an image captured by a camera 131 installed above the semiconductor wafer 12. Since the adhesive tape 24 has translucency, the camera 131 installed above allows the front surface 6A of the semiconductor wafer 12 in the dividing region 16 to be imaged with the adhesive tape 24 seen through, and allows the stuck state of the adhesive tape 24 to the front surface 6A of the semiconductor wafer 12 in each part of the dividing region 16 to be checked. Specifically, if there is a portion to which the adhesive tape 24 is not stuck, what is called a void in which air is bitten on the image appears. In other words, it can be seen that in the portion where no void occurs and other abnormalities do not appear, the adhesive tape 24 is stuck to the front surface 6A of the semiconductor wafer 12 without a gap S, and the second close contact portion 16A is formed.

It should be noted that the width of the second close contact portion 16A may be varied. This is because the shape of the second close contact portion 16A can be varied depending on the arrangement of the bumps 10 and the mode in which the adhesive tape 24 is stuck to the semiconductor wafer 12. Objects to be measured in this measuring step are preferably all the positions and widths, and what is called all point mapping may be performed. However, since performing all point mapping requires a lot of manufacturing time, as will be described below, at least the minimum value of the width of the second close contact portion 16A is measured so that whether or not the laser scribing step can be executed is determined.

Figure 2:
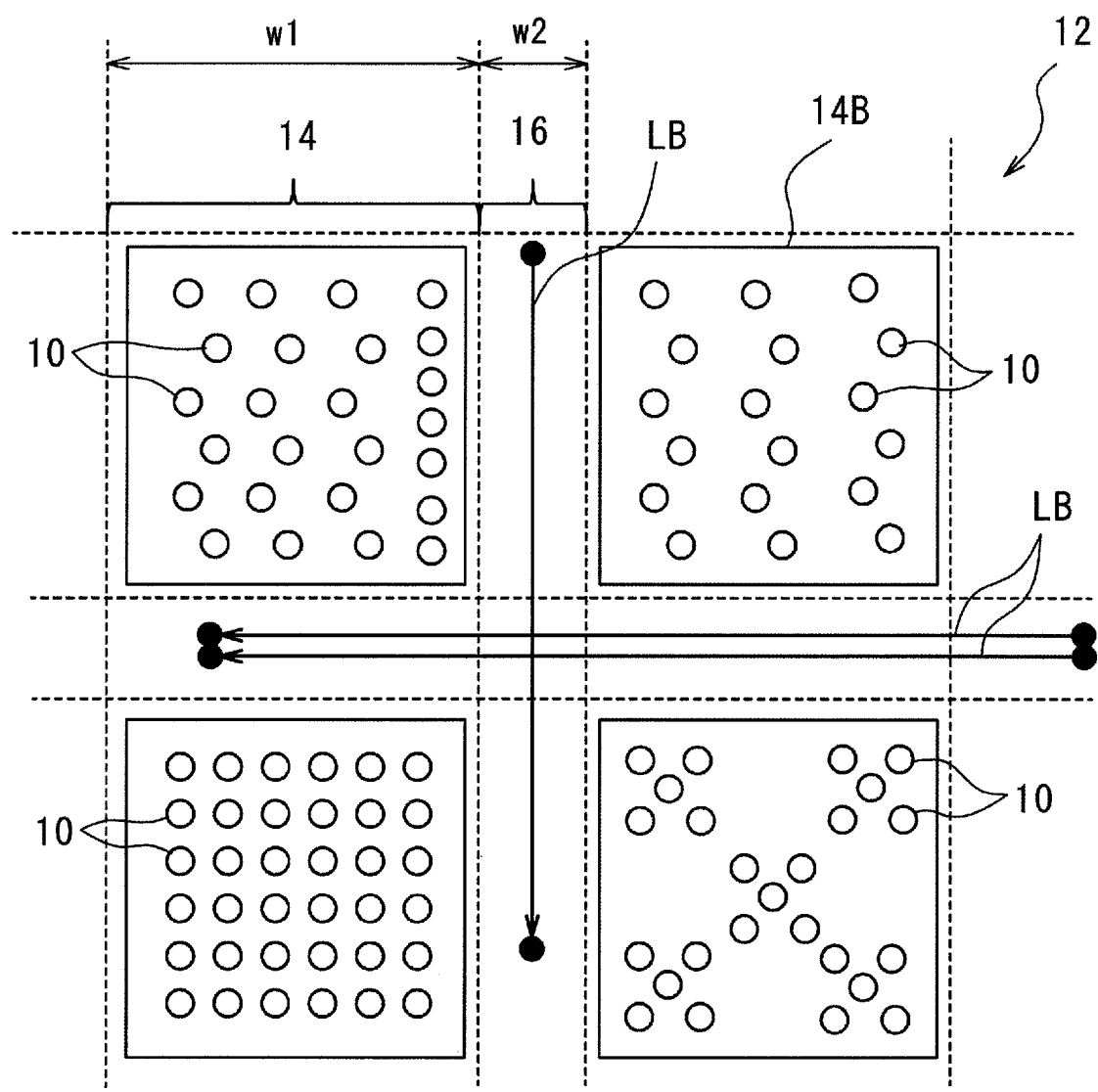
FIG. 2 is a plan view of a semiconductor wafer showing a positional relationship between respective regions in the measuring step.

FIG. 2 is a plan view of the semiconductor wafer 12 showing the positional relationship between the respective regions 14 and 16 in the measuring step. As shown in the drawing, on the semiconductor wafer 12, the street-shaped dividing regions 16 extending vertically and horizontally and the rectangular element regions 14 defined by the dividing regions 16 are provided. A width w1 of the element region 14 is, for example, 200 μm to 50 mm. A width w2 of the dividing region 16 is about 20 to 80 μm, and in the present embodiment, for example, 50 μm. In the element region 14, the plurality of bumps 10 are arranged. The arrangement of the bumps 10 is not necessarily regular and may be varied as shown in the illustrated example.

On the outer edge portion of the element region 14, a wiring pattern referred to as a seal ring 14B is formed. The seal ring 14B is for preventing peeling of the wiring layer 6 after the dicing step described below, and has a function of preventing the progress of peeling to the inside when peeling occurs at the boundary between the wiring layers 6. Since the outer edge portion of the element region 14 is formed by the seal ring 14B in this manner, the dividing region 16 can be regarded as a region outside the seal ring 14B.

The dividing region 16 in FIG. 2 schematically shows the locus of the laser beam applied in the following laser scribing step. The beam diameter is, for example, 5 to 20 μm, and is sufficiently smaller than the width w2 of the dividing region 16.

The laser scribing step shown in FIG. 1I cuts the adhesive tape 24 and the semiconductor wafer 12 by laser scribing in the portion corresponding to the dividing region 16 (see FIG. 1H) to form an exposed portion 18. At this time, based on the position and width of the second close contact portion 16A obtained in the measuring step as described below and the preset beam diameter, a laser beam is applied so as not to protrude from the second close contact portion 16A. Specifically, the position of the second close contact portion 16A may be linearly and continuously irradiated as shown in FIG. 2 with a laser beam having a beam diameter smaller than the minimum value of the width of the second close contact portion. The exposed portion 18 thus formed is a groove having a width according to the beam diameter. The width of the exposed portion 18 is, for example, 5 to 20 μm. Specifically, irradiating the wiring layer 6, the protective film 8, and the adhesive tape 24 with a laser beam to cut them forms the exposed portion 18. At this time, the semiconductor layer 4 may be partially cut or does not need to be cut, and is not completely cut. Therefore, when the semiconductor wafer 12 is viewed from the front surface 6A side, the semiconductor layer 4 is exposed in the exposed portion 18.

Figure 3:
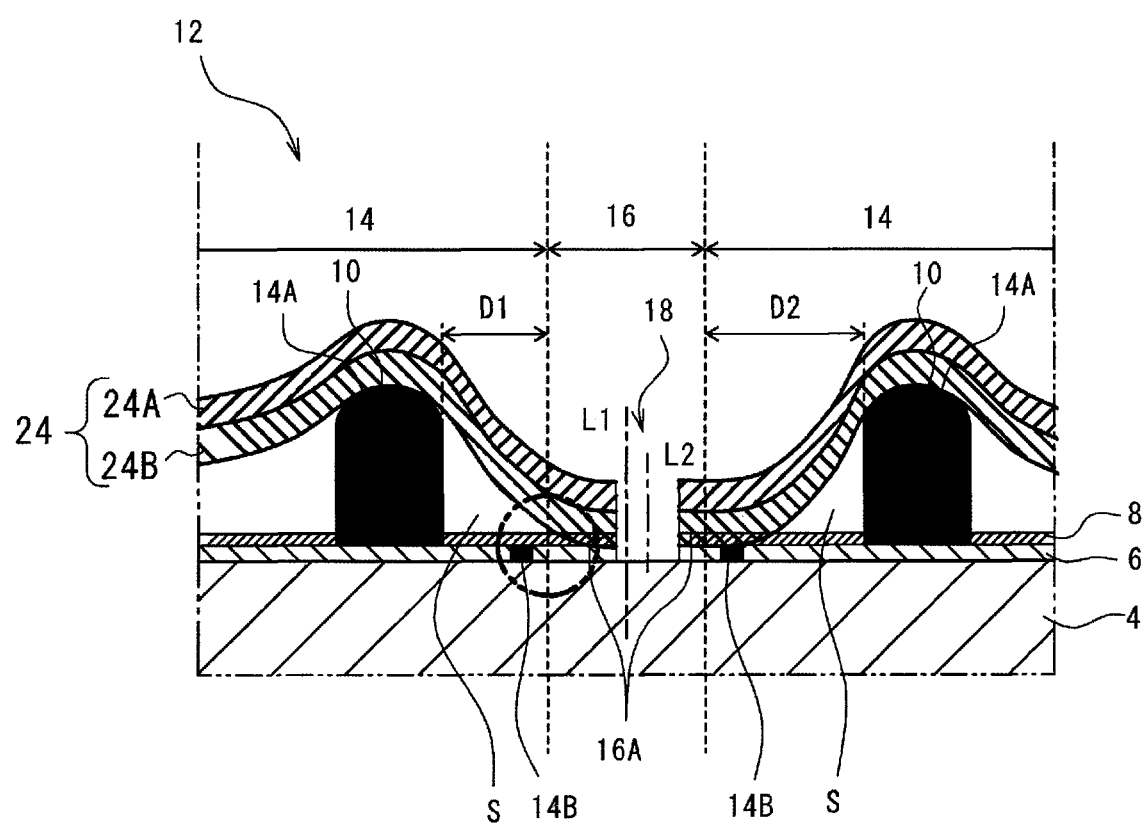
FIG. 3 is a cross-sectional view of a dividing region in the laser scribing step.

FIG. 3 is a cross-sectional view of the dividing region 16 in the laser scribing step. As in the example shown in FIG. 3, in the dividing region 16, the adhesive tape 24 is not necessarily in close contact, and a gap S may occur in the dividing region 16 between the adhesive tape 24 and the semiconductor wafer 12 (see an inside of the broken line circle). That is, not all of the dividing regions 16 may become the second close contact portions 16A. In the laser scribing step, the exposed portion 18 is formed by irradiating the dividing region 16 with a laser beam, but more precisely, it is preferable to irradiate the second close contact portion 16A with a laser beam. If the region where the gap S exists of the dividing region 16 is irradiated with a laser beam, there is a possibility that an end portion of the adhesive tape 24 peels off from the front surface 6A of the semiconductor wafer 12 when the adhesive tape 24 is cut by the laser beam. Then, debris (cutting debris) may enter between the adhesive tape 24 and the semiconductor wafer 12 from the peeled portion, and the debris may stick to the front surface 6A of the semiconductor wafer 12. In order to prevent this, in the present embodiment, as will be described below, the second close contact portion 16A of the dividing region 16 is irradiated with a laser beam so that the adhesive tape 24 does not peel off.

Referring also to FIGS. 2 and 3, in general, the irradiation position of the laser beam is often the center of the dividing region 16 (see the center line L1 in FIG. 3). This is because during the laser scribing being performed, a locus is generally determined in advance, and the center line L1 can be determined in advance without the sticking state being detected.

However, as in the example shown in FIG. 3, the bumps 10 may not be formed symmetrically with respect to the dividing region 16. In the drawing, a distance D1 between the bump 10 on the left side and the dividing region 16 is, for example, 35 μm, but in the drawing, a distance D2 between the bump 10 on the right side and the dividing region 16 is, for example, 50 μm. In the case of such an asymmetric shape, the center of the dividing region 16 (center line L1) may deviate from the center of the second close contact portion 16A (center line L2). In that case, when the laser beam is applied along the center line L1 of the dividing region 16, there is a risk of applying the laser beam to the region other than the second close contact portion 16A (that is, the region where the gap S is generated) as shown in the broken line circle in FIG. 3. Furthermore, as shown in FIG. 2, since a plurality of lines of laser beams are sometimes applied, in order to ensure the irradiation range of the laser beam as wide as possible, the laser beam is preferably applied along the center line L2 of the second close contact portion 16A. The irradiation locus of the laser beam is not limited to linear irradiation along the center line L1 and the center line L2, and may be a locus including a polygonal (zigzag) line or a curved line set to avoid the gap S based on the data acquired in the measuring step.

Preferably, when the width of the second close contact portion 16A measured in the measuring step is larger than the beam diameter of the laser beam, the laser beam irradiation is performed, and when the width of the second close contact portion 16A is equal to the beam diameter of the laser beam or smaller than the beam diameter, the laser beam irradiation is not performed. In the present embodiment, the determination is made by a control device 180 described below.

Figure 4:
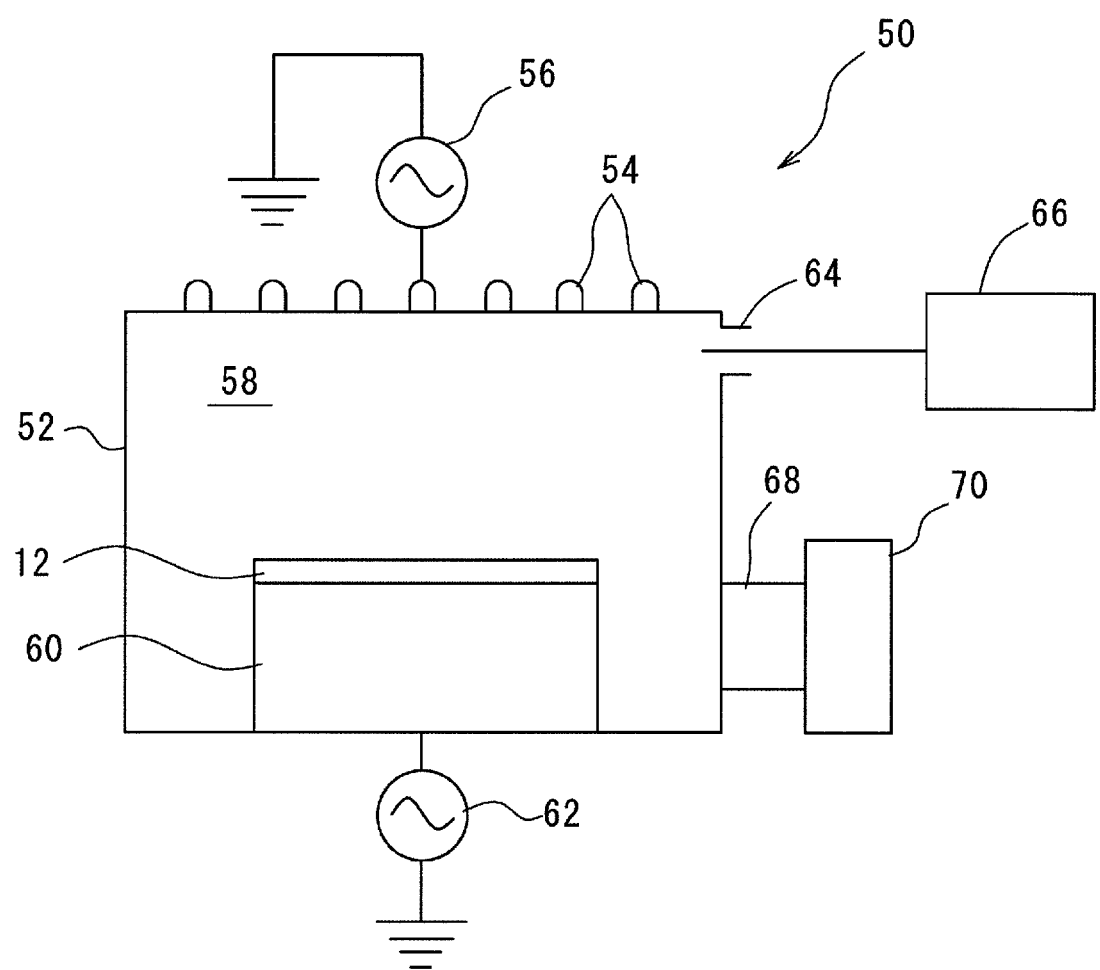
FIG. 4 is a schematic diagram of a plasma etching apparatus.

In the dicing step shown in FIG. 1J, the semiconductor wafer 12 is diced by plasma etching (plasma dicing) with the back surface 4A of the semiconductor wafer 12 held with the dicing tape 22. Furthermore, FIG. 4 shows an example of a dry etching apparatus (plasma etching apparatus) 50 used in this step. Dielectric windows are provided at the top of a chamber 52 of the dry etching apparatus 50, and antennas 54 as upper electrodes are arranged above the dielectric windows. The antenna 54 is electrically connected to a first high frequency power supply unit 56. On the other hand, a stage 60 on which the semiconductor wafer 12 is arranged is disposed on the bottom side of a treatment chamber 58 in the chamber 52. The stage 60 also functions as a lower electrode and is electrically connected to a second high frequency power supply unit 62. In addition, the stage 60 includes an electrostatic attracting electrode (ESC electrode) (not shown), and the dicing tape 22 placed on the stage 60 (that is, semiconductor wafer 12) can be electrostatically attracted to the stage 60. Instead of this, a vacuum attracting mechanism may be adopted, and the dicing tape 22 placed on the stage 60 (that is, semiconductor wafer 12) may be vacuum attracted to the stage 60. In addition, the stage 60 includes a cooling gas hole for supplying a cooling gas (not shown), and supplying a cooling gas such as helium from the cooling gas hole allows the semiconductor wafer 12 electrostatically attracted to the stage 60 to be cooled. A gas inlet 64 of the chamber 52 is fluidly connected to an etching gas source 66 and an exhaust port 68 is connected to a vacuum exhaust unit 70 including a vacuum pump for evacuating the inside of the chamber 52.

In this dicing step, the semiconductor wafer 12 is placed on the stage 60 via the dicing tape 22, the inside of the treatment chamber 58 is evacuated by the vacuum exhaust unit 70, and an etching gas such as $SF_6$ is supplied from the etching gas source 66 into the treatment chamber 58. Then, the inside of the treatment chamber 58 is maintained at a predetermined pressure, high-frequency power is supplied from the first high frequency power supply unit 56 to the antenna 54, plasma is generated in the treatment chamber 58, and the semiconductor wafer 12 is irradiated with the plasma. At this time, the semiconductor layer 4 of the semiconductor wafer 12 exposed at the exposed portion 18 is removed by the physicochemical action of radicals and ions in the plasma. Through this dicing step, the semiconductor wafer 12 is formed on the individual rectangular semiconductor chips 2.

In the mask removing step shown in FIG. 1K, the adhesive tape 24 as a mask is removed from the front surface 6A of the semiconductor chip 2. Simply, the adhesive tape 24 may be mechanically peeled off, but since it takes time to peel off the adhesive tape 24 one by one from each of the diced semiconductor chips 2, it is preferable that the adhesive tape 24 can be removed together.

Instead of mechanical peeling, for example, a material of a water-soluble resin may be adopted as the adhesive tape 24, and the adhesive tape 24 may be removed together by water washing. As the water-soluble resin, a synthetic resin containing polyvinyl alcohol, oxazole and lithium styrenesulfonate, polyester or the like can be used.

In still another example, instead of water washing, the adhesive tape 24 may be removed by ashing. Specifically, a gas type different from that in the plasma etching in the dicing step may be used, an adhesive tape 24 reacting to the gas type may be used, and the adhesive tape 24 may be removed together by etching. Furthermore, reducing the degree of ashing, performing what is called light ashing, and then water washing may be used.

In this way, the semiconductor chip 2 is manufactured through the steps in FIGS. 1A to 1K.

Figure 5:
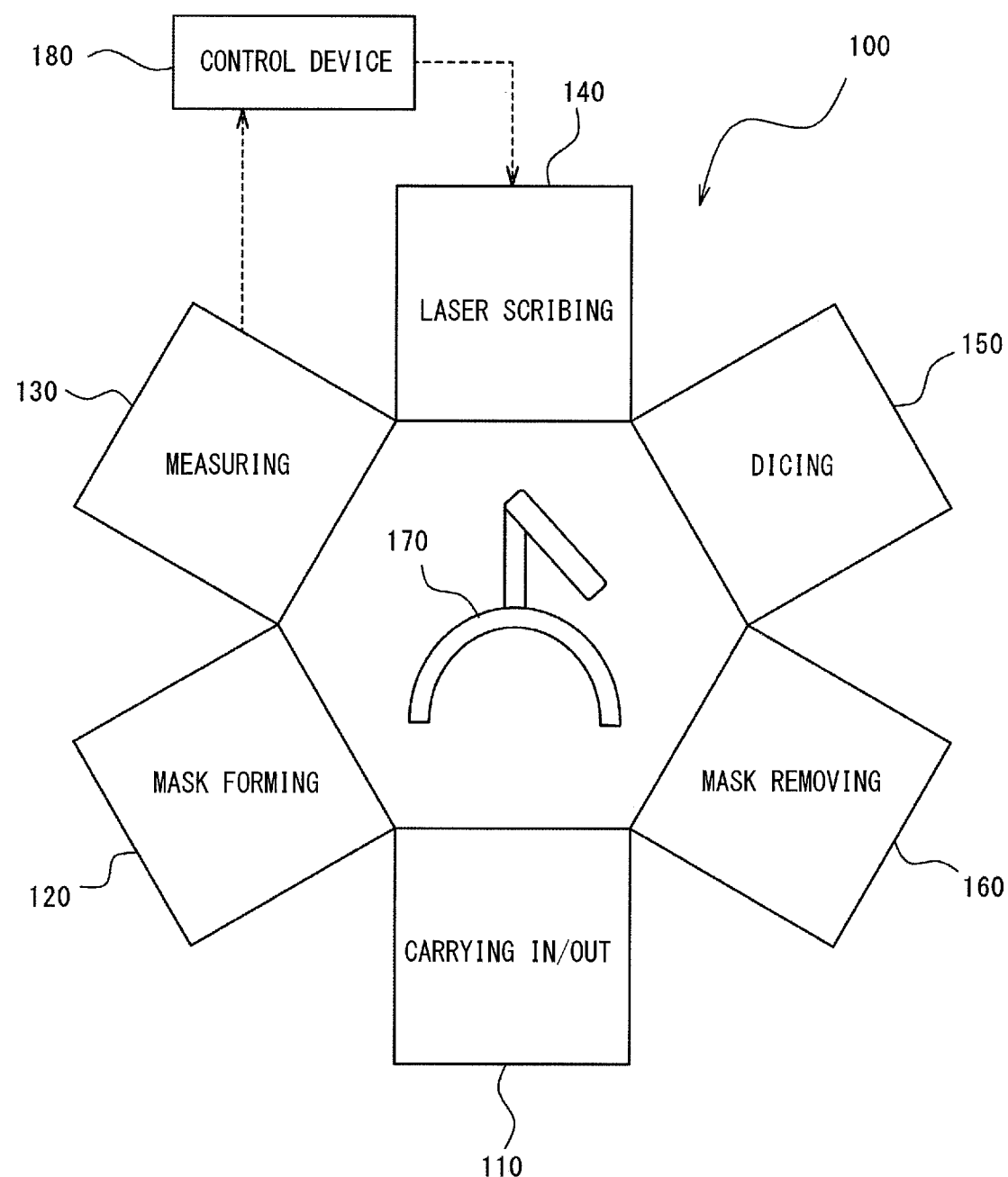
FIG. 5 is a schematic configuration diagram of an element chip manufacturing apparatus.

FIG. 5 shows a manufacturing apparatus 100 of a semiconductor chip (element chip) for executing the above series of steps. The manufacturing apparatus 100 includes a carrying in/out unit 110, a mask forming unit 120, a measuring unit 130, a laser scribing unit 140, a dicing unit 150, a mask removing unit 160, a conveying mechanism 170, and the control device 180. The conveyance of the semiconductor wafer 12 between the respective units 110 to 160 is performed by the conveying mechanism 170.

The semiconductor wafer 12 having gone through the first preparation step, the second preparation step, the protection step, the thinning step, the first holding step, and the second holding step is carried in the carrying in/out unit 110. The carried-in semiconductor wafer 12 is conveyed to the mask forming section 120, and a mask forming step is executed. Next, the semiconductor wafer 12 is conveyed to the measuring unit 130, and the measuring step is executed. The measurement result in the measuring unit 130 is sent to the control device 180. Next, the semiconductor wafer 12 is conveyed to the laser scribing unit 140, and the laser scribing step is executed. However, under the control of the control device 180, when the width of the second close contact portion 16A measured in the measuring step is larger than the beam diameter of the laser beam, the laser beam irradiation is performed and the series of treatment is continued, and when the width of the second close contact portion 16A is equal to the beam diameter of the laser beam or smaller than the beam diameter, the laser beam irradiation is not performed and the series of treatment is finished. When the series of treatment is continued, the semiconductor wafer 12 is conveyed to the dicing unit 150, and the dicing step is executed. Next, the semiconductor wafer 12 is conveyed to the mask removing unit 160, and the mask removing step is executed. Then, after all these steps are completed, the semiconductor wafer 12 is taken out from the carrying in/out unit 110 as the semiconductor chip 2.

According to the method for manufacturing an element chip of the present embodiment, on the front surface (first surface) 6A of the dividing region 16 to be cut by laser scribing in the laser scribing step, it can be checked in the measuring step that the second close contact portion 16A is formed to have a size that allows laser scribing. Specifically, since the translucent adhesive tape 24 is used as the mask, it can be easily determined by image recognition or the like whether the adhesive tape 24 sticks to the front surface 6A of the semiconductor wafer 12. Thus, the position and width of the second close contact portion 16A can be easily detected. Therefore, in consideration of the position and width and the preset beam diameter, the second close contact portion 16A can be laser-scribed accurately. As a result, since the laser scribing is performed with the adhesive tape 24 completely in close contact, it is possible to prevent debris from entering between the adhesive tape 24 and the substrate and sticking to the front surface of the substrate.

In addition, according to the present embodiment, the laser scribing step is executed only when the width of the second close contact portion 16A is equal to or smaller than the beam diameter of the laser beam. If the laser scribing step is executed in other cases, laser scribing is performed in a region other than the second close contact portion 16A, that is, laser scribing is performed in a region where the adhesive tape 24 is not in close contact. Then, a region not covered with the adhesive tape 24 appears, and there is a possibility of allowing debris to enter the adhesive tape 24. Therefore, in that case, the laser beam is not applied, and debris is prevented from sticking to the front surface 6A of the semiconductor wafer 12.

Second Embodiment

FIGS. 6A to 6F show respective manufacturing steps in a method for manufacturing a semiconductor chip (element chip) 2 according to the second embodiment. FIGS. 6A to 6F respectively show a first mask forming step, a second mask forming step, a measuring step, a laser scribing step, a dicing step, and a mask removing step. It should be noted that the first preparation step, the second preparation step, the protection step, the thinning step, the first holding step, and the second holding step in the first embodiment are also executed in the present embodiment as in the first embodiment, but since the contents are the same, the description thereof will be omitted. In addition, also in the first mask forming step, the second mask forming step, the measuring step, the laser scribing step, the dicing step, and the mask removing step, descriptions of the same contents as those in the first embodiment may be omitted.

Figure 6A:
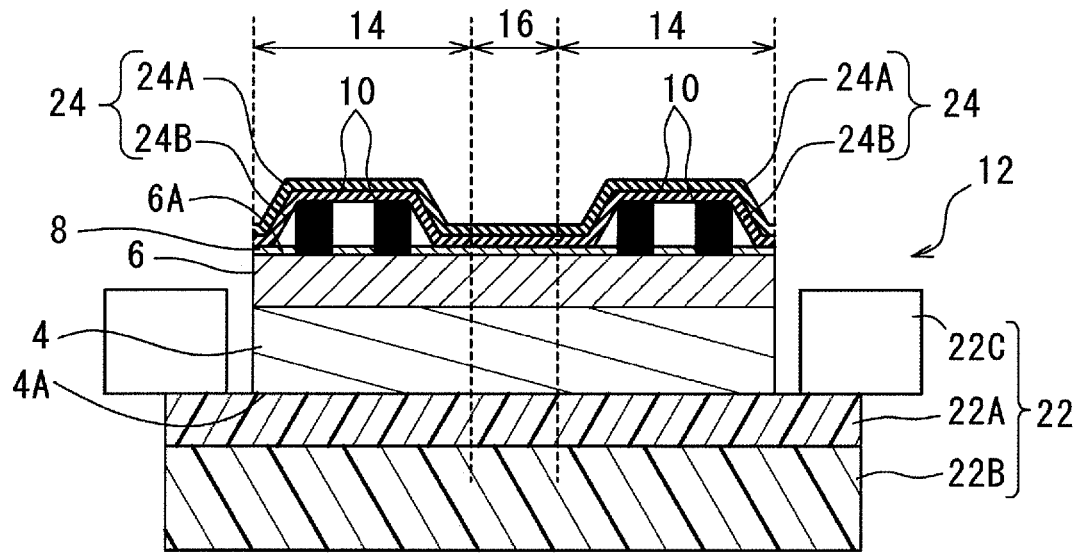
FIG. 6A is a cross-sectional view showing a first mask forming step in a method for manufacturing an element chip according to a second embodiment.

In the first mask forming step shown in FIG. 6A, an adhesive tape 24 is stuck to a front surface 6A of a semiconductor wafer 12. The thickness of the adhesive tape 24 is about 5 to 50 μm, and in the present embodiment, for example, 20 μm. The adhesive tape 24 has a two-layer structure including a base material layer 24A as a base and an adhesive layer 24B to be stuck to the semiconductor wafer 12.

Figure 6B:
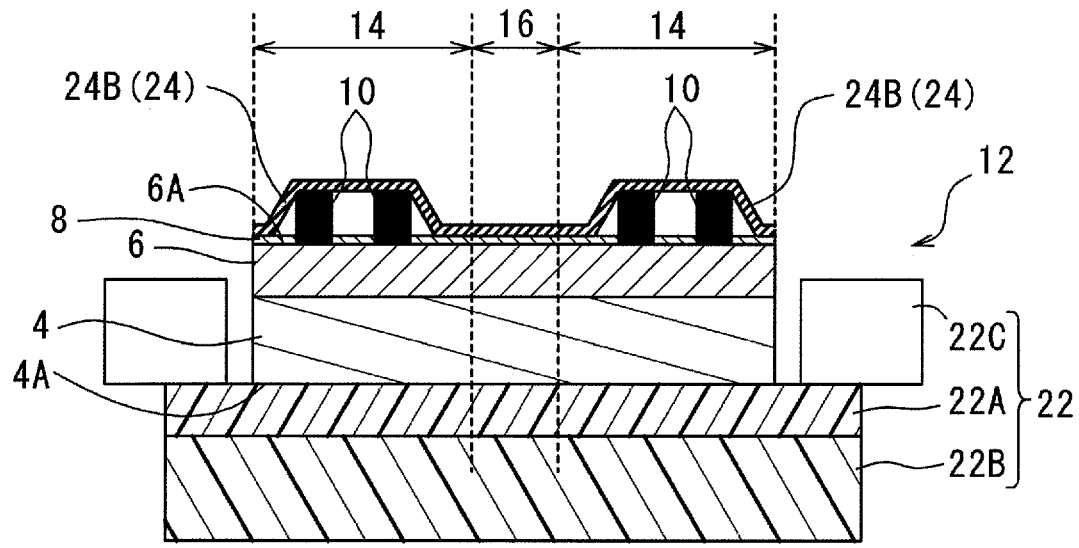
FIG. 6B is a cross-sectional view showing a second mask forming step in the method for manufacturing an element chip according to the second embodiment.

In the second mask forming step shown in FIG. 6B, the base material layer 24A of the adhesive tape 24 is peeled off. Specifically, only the base material layer 24A is removed with the adhesive layer 24B left. Hereinafter, the remaining adhesive layer 24B is simply referred to as an adhesive tape 24. In the present embodiment, the adhesive layer 24B is transparent and the portion to which the adhesive layer 24B is stuck can be seen through the adhesive layer 24B. In addition, the adhesive layer 24B has plasma resistance. Therefore, the portion to which the adhesive layer 24B is stuck of the semiconductor wafer 12 is protected from the subsequent plasma etching. That is, the adhesive layer 24B functions as a mask against the plasma. It should be noted that since the base material layer 24A of the adhesive tape 24 is removed in the present step, the material is not particularly limited, and any material can be used.

Figure 6C:
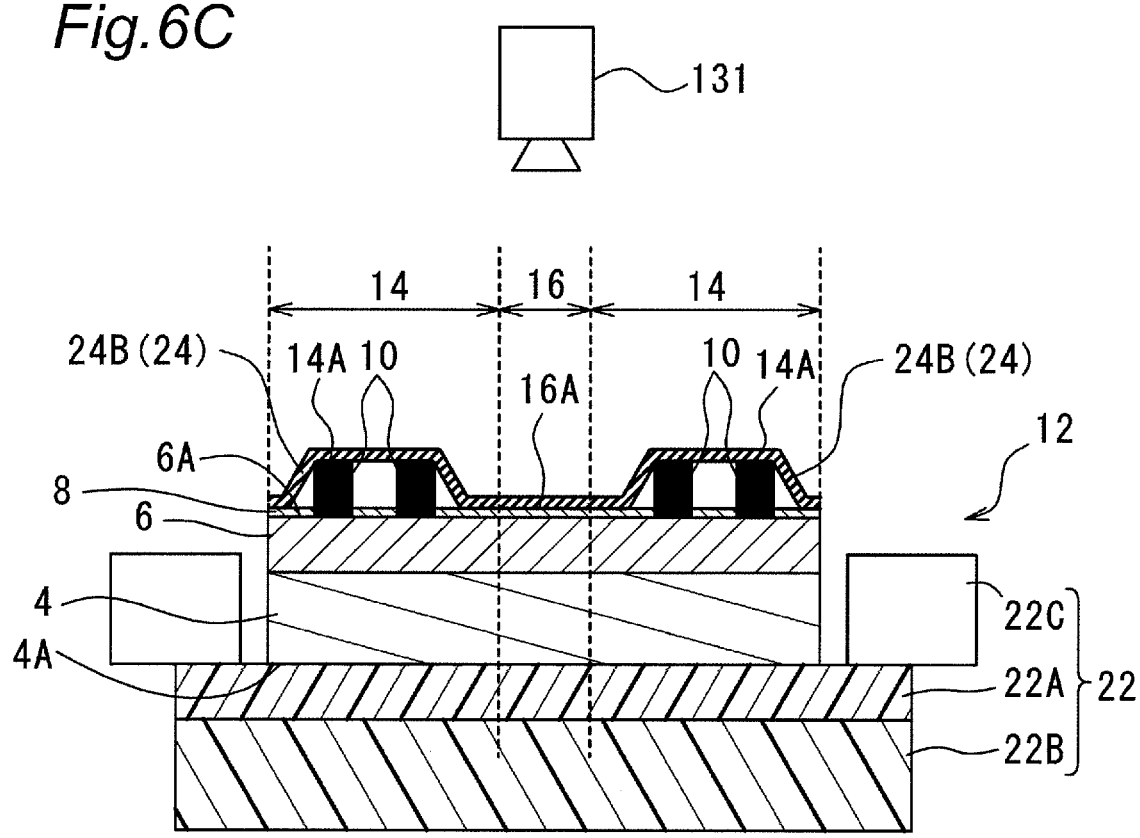
FIG. 6C is a cross-sectional view showing a measuring step in the method for manufacturing an element chip according to the second embodiment.
Figure 6D:
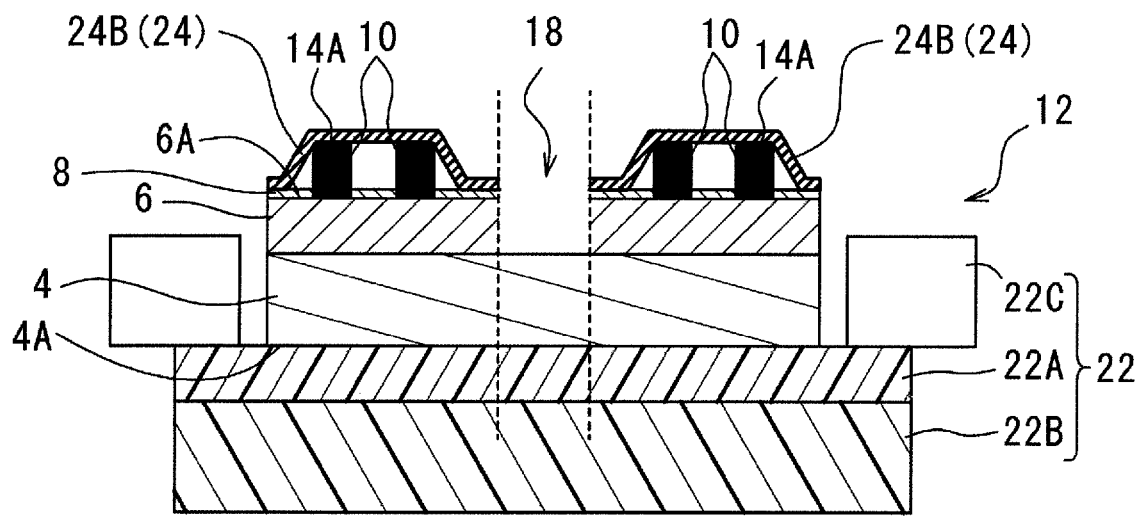
FIG. 6D is a cross-sectional view showing a laser scribing step in the method for manufacturing an element chip according to the second embodiment.
Figure 6E:
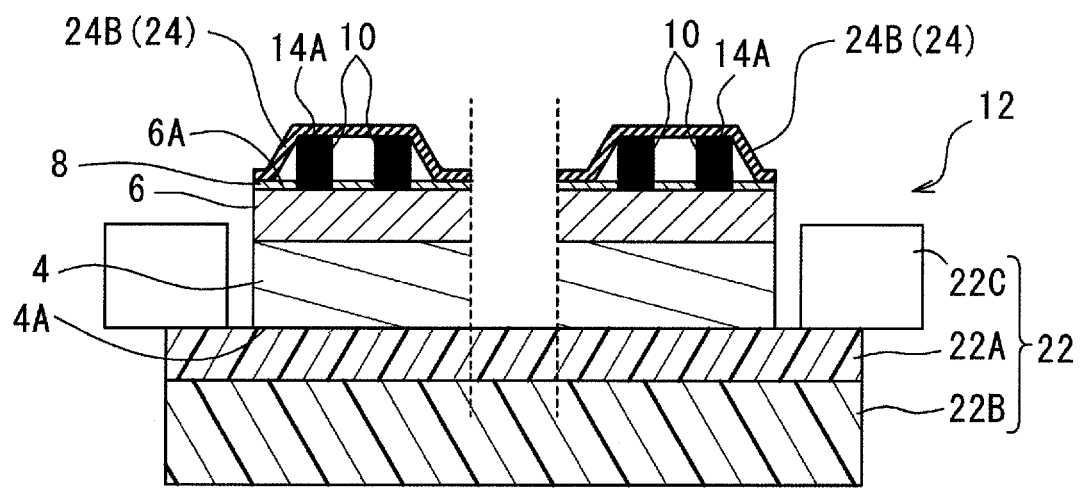
FIG. 6E is a cross-sectional view showing a dicing step in the method for manufacturing an element chip according to the second embodiment.
Figure 6F:
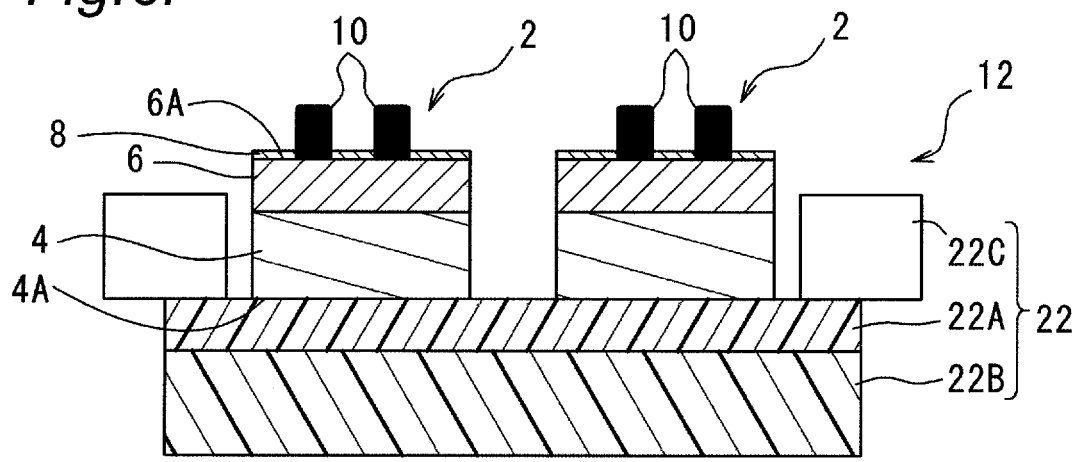
FIG. 6F is a cross-sectional view showing a mask removing step in the method for manufacturing an element chip according to the second embodiment.

The measuring step shown in FIG. 6C, the laser scribing step shown in FIG. 6D, the dicing step shown in FIG. 6E, and the mask removing step shown in FIG. 6F are the same as those in the first embodiment except that only the adhesive layer 24B is used as the adhesive tape 24.

The method for manufacturing an element chip according to the present embodiment is performed by a manufacturing apparatus 100 the same as that of the first embodiment (see FIG. 5). However, the treatment differs from that of the first embodiment in that both the first mask forming step and the second mask forming step are executed in a mask forming unit 120.

According to the present embodiment, in and after the second mask forming step, the adhesive tape 24 changes to only the adhesive layer 24B. Therefore, as compared with the first embodiment, in the measuring step, when imaging is performed with the adhesive tape 24 seen through by using a camera 131, since imaging only has to be performed with only one layer seen through, it is easy to recognize images. In addition, since only the adhesive layer 24B only has to be removed in the mask removing step, the treatment is simpler than that of the first embodiment, and the adhesive tape 24 can be prevented from remaining.

Third Embodiment

A method for manufacturing a semiconductor chip 2 of the present embodiment is substantially the same as that of the first embodiment except the mask forming step. Therefore, description of parts similar to those of the first embodiment will be omitted. First, as in the first embodiment, the first preparation step (FIG. 1A), the second preparation step (FIG. 1B), the protection step (FIG. 1C), the thinning step (FIG. 1D), the first holding step (FIG. 1E), and the second holding step (FIG. 1F) are sequentially performed.

Figure 7A:
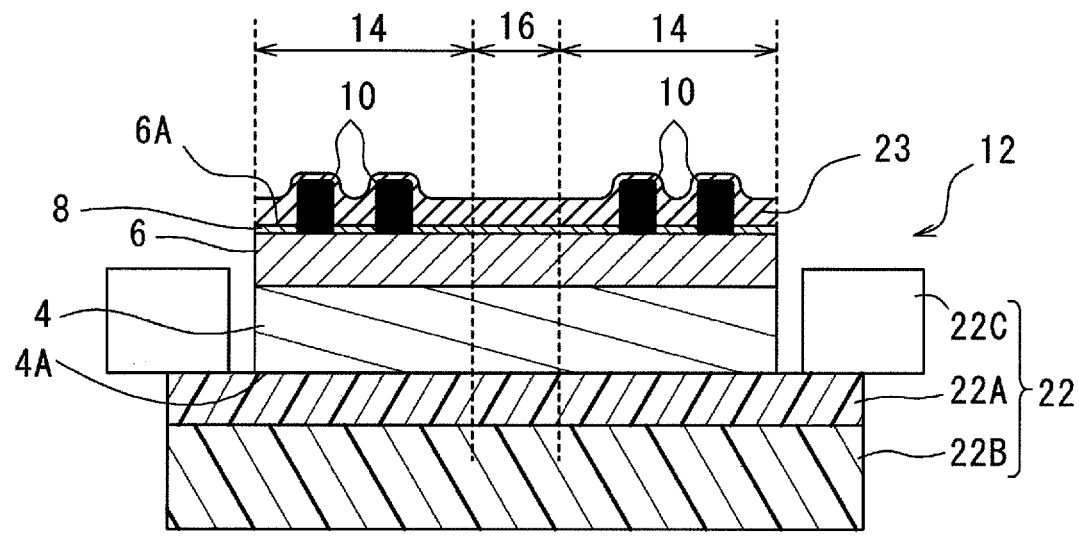
FIG. 7A is a cross-sectional view showing a first mask forming step in a method for manufacturing an element chip according to a third embodiment.

In the first mask forming step shown in FIG. 7A, a water-soluble resin 23 is applied onto the front surface of a semiconductor wafer 12. The resin 23 is applied to reduce the level difference on the front surface of the semiconductor wafer 12. Spray coating or spin coating can be adopted as the application method of the resin 23. In the present embodiment, since bumps 10 are formed in an element region 14, the height of the element region 14 is higher than the height of a dividing region 16. Therefore, in order to reduce the level difference, it is necessary to apply the resin 23 to at least the dividing region 16. In the example in FIG. 7A, spin coating is adopted as the application method of the resin 23, and the resin 23 is applied to the entire front surface 6A of the semiconductor wafer 12. At this time, since the thickness of the resin 23 formed in the element region 14, particularly the bumps 10, is smaller than the thickness of the resin 23 formed in the dividing region 16, the level difference on the semiconductor wafer 12 is reduced. Instead of this, the resin may be applied only to the dividing region 16 by a spray nozzle or a dispenser.

Figure 7B:
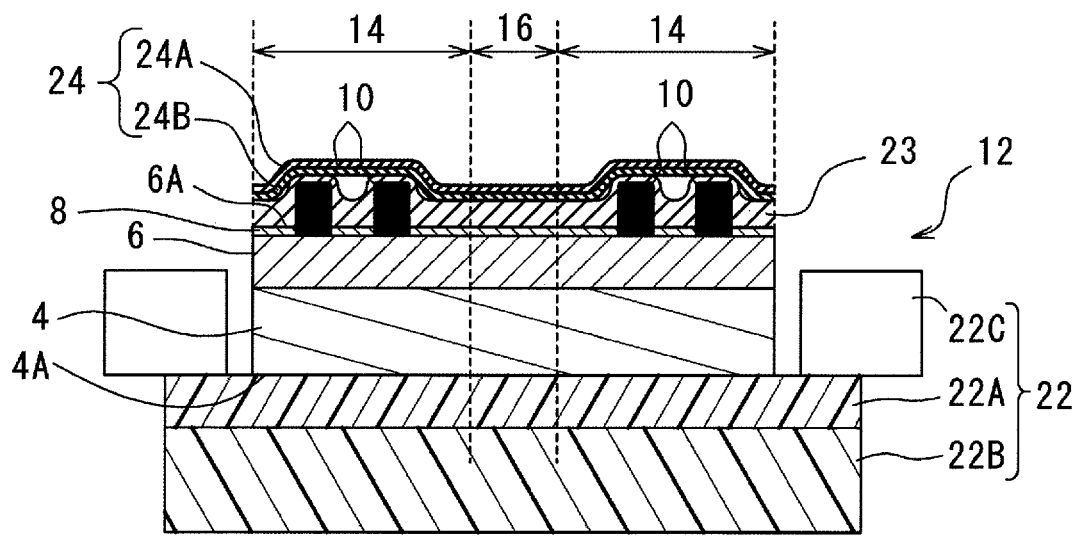
FIG. 7B is a cross-sectional view showing a second mask forming step in the method for manufacturing an element chip according to the third embodiment.

In the second mask forming step shown in FIG. 7B, a water-soluble adhesive tape 24 is pressed against the front surface 6A of the semiconductor wafer 12 to be stuck. The thickness of the adhesive tape 24 is about 5 to 50 µm, and in the present embodiment, for example, 20 µm. The adhesive tape 24 has a two-layer structure including a base material layer 24A as a base and an adhesive layer 24B to be stuck to the semiconductor wafer 12. In the present embodiment, both the base material layer 24A and the adhesive layer 24B have water solubility. In addition, the adhesive tape 24 (in particular, the base material layer 24A) has plasma resistance. Therefore, the portion to which the adhesive tape 24 is stuck of the semiconductor wafer 12 is protected from the subsequent plasma etching. That is, the adhesive tape 24 functions as a mask against the plasma.

Figure 8:
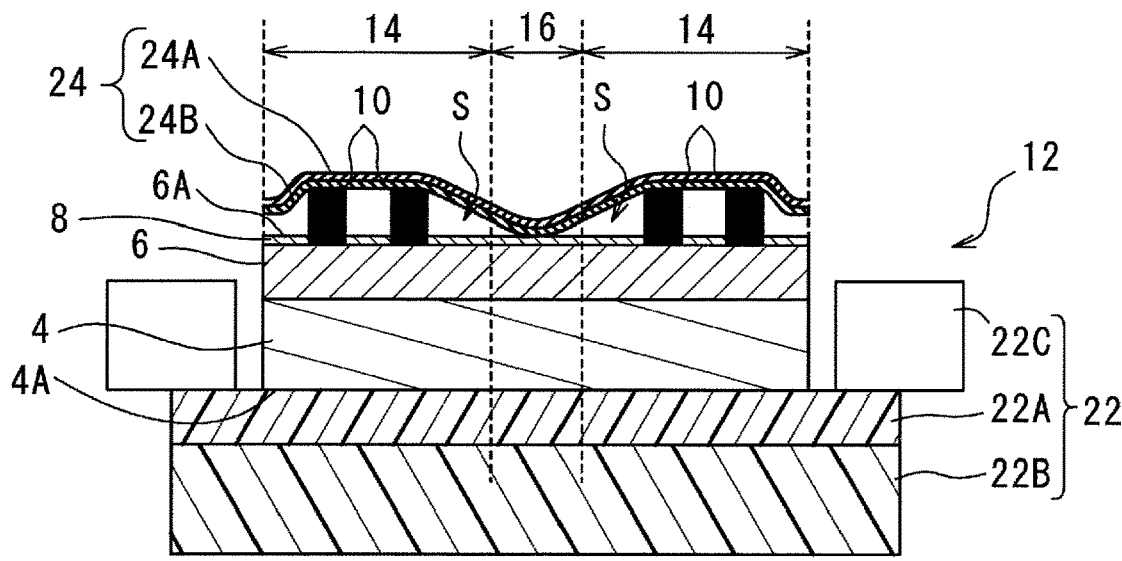
FIG. 8 is a plan view of a semiconductor wafer showing a positional relationship between respective regions in the laser scribing step.

FIG. 8 is a cross-sectional view when the second mask forming step is virtually performed without the first mask forming step being performed. When FIG. 7B is compared with FIG. 8, in FIG. 8, a gap S is generated between the periphery of the bump 10 and the adhesive tape 24, whereas in FIG. 7B, the gap S is substantially not generated. In addition, even if any gap S is generated, it is relatively small. Therefore, executing the first mask forming step allows the generation of the gap S to be prevented or the gap S to be made small. In the illustrated example, the gap S is generated due to the level difference caused by the bump 10 protruding from the front surface 6A of the semiconductor wafer 12, but the factors of forming the level difference are variously considered other than the bump 10, and for example, the height difference may also be formed by other mounted components mounted on the front surface of the semiconductor wafer 12. In addition, when the semiconductor wafer 12 includes a CMOS image sensor or an MEMS element, a height difference may also be formed due to a lens included in the CMOS image sensor or a structure included in the MEMS element. Therefore, actually, as illustrated, not only in the periphery of the bump 10 but also in various modes, the gap S may occur.

The smaller the gap S generated in the dividing region 16 is, the more preferable it is, and the gap S does not affect the subsequent step. Therefore, after sticking the adhesive tape 24, in consideration of the possibility of generation of the gap S, further pressing only the dividing region 16, or using a thermoplastic adhesive tape 24, softening the adhesive tape 24 by applying heat, and then pressing the adhesive tape 24 allows the gap S to be reduced. In addition, after sticking the adhesive tape 24, putting the semiconductor wafer 12 into a vacuum chamber to reduce the pressure stepwise allows the air in the gap S to be exhausted, the gap S to be reduced, and the gap S to be decreased.

Figure 7C:
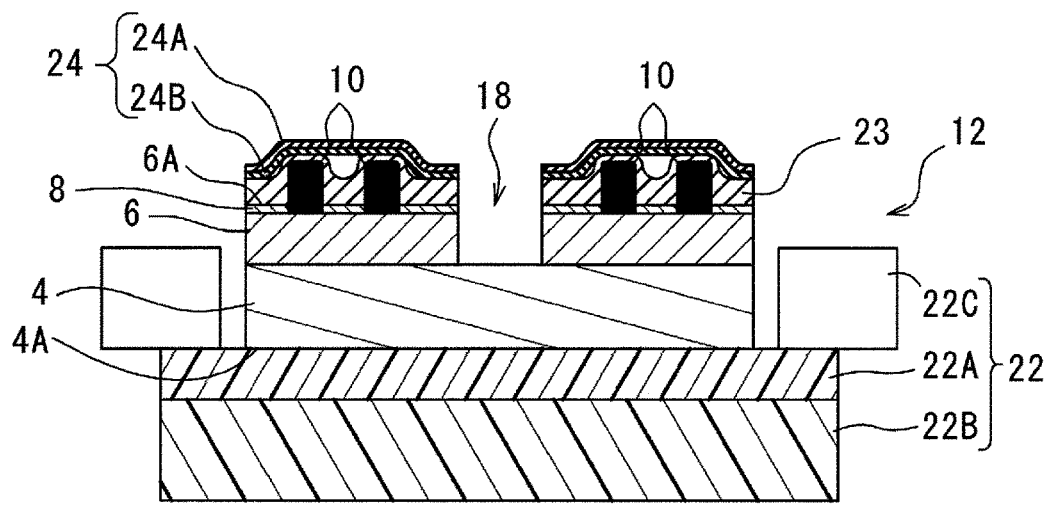
FIG. 7C is a cross-sectional view showing a laser scribing step in the method for manufacturing an element chip according to the third embodiment.

The laser scribing step shown in FIG. 7C cuts the adhesive tape 24, the resin 23, and the semiconductor wafer 12 by laser scribing in the portion corresponding to the dividing region 16 (see FIG. 7B) to form an exposed portion 18. Specifically, irradiating a wiring layer 6, a protective film 8, the resin 23, and the adhesive tape 24 with a laser beam to cut them forms the exposed portion 18. At this time, a semiconductor layer 4 may be partially cut or does not need to be cut, and is not completely cut. Therefore, when the semiconductor wafer 12 is viewed from the front surface 6A side, the semiconductor layer 4 is exposed in the exposed portion 18.

Figure 9:
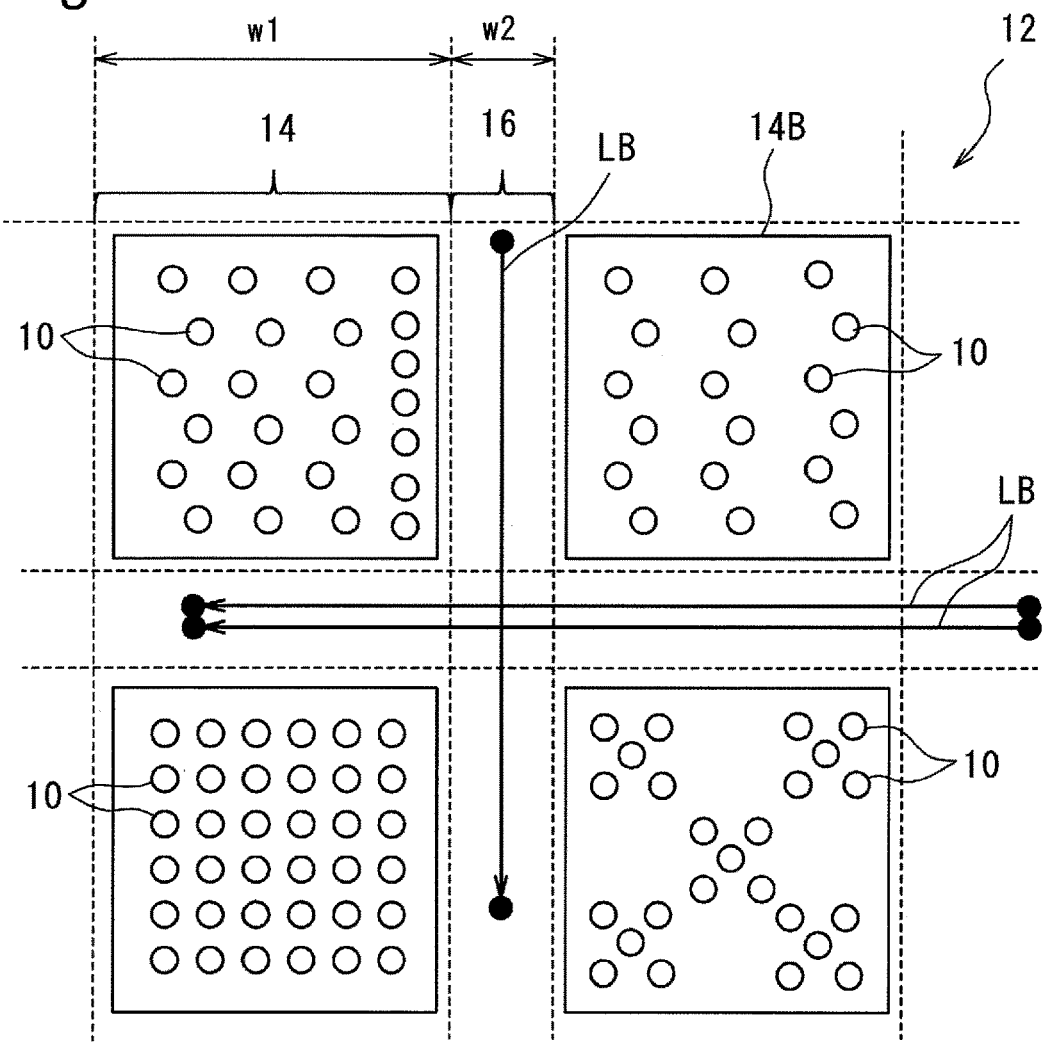
FIG. 9 is a cross-sectional view showing a comparative example of a second mask forming step of the third embodiment.

FIG. 9 is a plan view of the semiconductor wafer 12 showing the positional relationship between the respective regions 14 and 16 in the laser scribing step. As shown in the drawing, on the semiconductor wafer 12, the street-shaped dividing regions 16 extending vertically and horizontally and the rectangular element regions 14 defined by the dividing regions 16 are provided. A width w1 of the element region 14 is, for example, 200 µm to 50 mm. A width w2 of the dividing region 16 is about 20 to 80 µm, and in the present embodiment, for example, 50 µm. In the element region 14, the plurality of bumps 10 are arranged. The arrangement of the bumps 10 is not necessarily regular and may be varied as shown in the illustrated example.

On the outer edge portion of the element region 14, a wiring pattern referred to as a seal ring 14B is formed. The seal ring 14B is for preventing peeling of the wiring layer 6 after the dicing step described below, and has a function of preventing the progress of peeling to the inside when peeling occurs at the boundary between the wiring layers 6. Since the outer edge portion of the element region 14 is formed by the seal ring 14B in this manner, the dividing region 16 can be regarded as a region outside the seal ring 14B.

The dividing region 16 in FIG. 9 schematically shows the locus of the laser beam applied in the laser scribing step (see reference numeral LB). The beam diameter is, for example, 5 to 20 µm, and is sufficiently smaller than the width w2 of the dividing region 16. The laser beam is applied while linearly moving within the dividing region 16. The laser beam application may be in one line or two or more lines.

As in the comparative example shown in FIG. 8, in the dividing region 16, the adhesive tape 24 is not necessarily in close contact in all the regions, and a gap S may occur in the dividing region 16 between the adhesive tape 24 and the semiconductor wafer 12. The exposed portion 18 is formed by irradiating the dividing region 16 with a laser beam (see FIG. 7C), and preferably, the dividing region 16 with which the adhesive tape 24 is in close contact is irradiated with a laser beam. If the region where the gap S exists of the dividing region 16 is irradiated with a laser beam, there is a possibility that an end portion of the adhesive tape 24 peels off from the front surface 6A of the semiconductor wafer 12 when the adhesive tape 24 is cut by the laser beam. Then, debris (cutting debris) may enter between the adhesive tape 24 and the semiconductor wafer 12 from the peeled portion, and the debris may stick to the front surface 6A of the semiconductor wafer 12. In order to prevent this, in the present embodiment, the resin 23 is applied to the semiconductor wafer 12 in the first mask forming step, and the laser beam is applied while the occurrence of the gap S (see FIG. 8) is prevented in the second mask forming step, so that the adhesive tape 24 does not peel off.

Figure 7D:
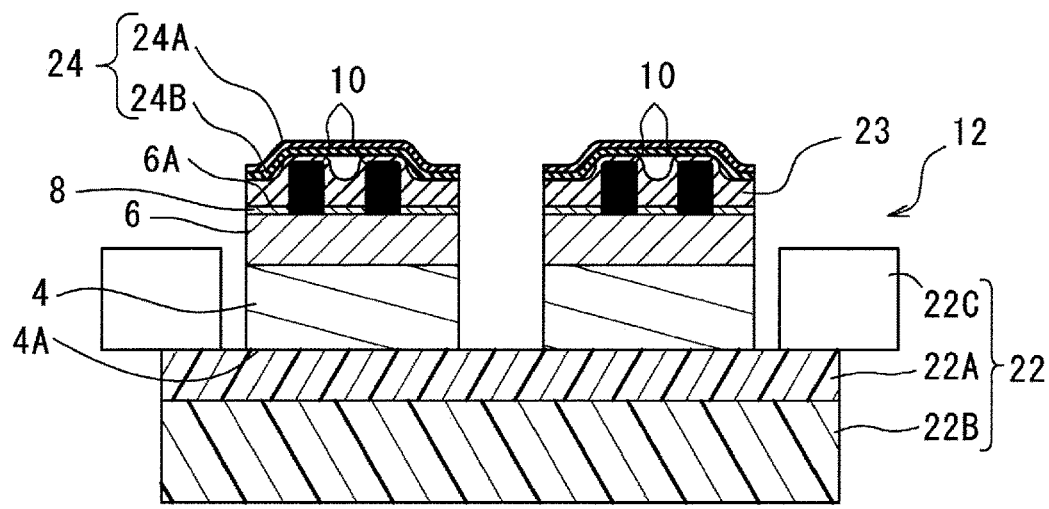
FIG. 7D is a cross-sectional view showing a dicing step in the method for manufacturing an element chip according to the third embodiment.

In the dicing step shown in FIG. 7D, the semiconductor wafer 12 is diced by plasma etching (plasma dicing) with a back surface 4A of the semiconductor wafer 12 held with a dicing tape 22. A dry etching apparatus (plasma etching apparatus) 50 used in the present step is the same as that of the first embodiment shown in FIG. 2.

In this dicing step, the semiconductor wafer 12 is placed on a stage 60 via the dicing tape 22, the inside of a treatment chamber 58 is evacuated by a vacuum exhaust unit 70, and an etching gas such as $SF_6$ is supplied from an etching gas source 66 into the treatment chamber 58. Then, the inside of the treatment chamber 58 is maintained at a predetermined pressure, high-frequency power is supplied from a first high frequency power supply unit 56 to an antenna 54, plasma is generated in the treatment chamber 58, and the semiconductor wafer 12 is irradiated with the plasma. At this time, the semiconductor layer 4 of the semiconductor wafer 12 exposed at the exposed portion 18 is removed by the physicochemical action of radicals and ions in the plasma. Through this dicing step, the semiconductor wafer 12 is formed on individual rectangular semiconductor chips 2.

Figure 7E:
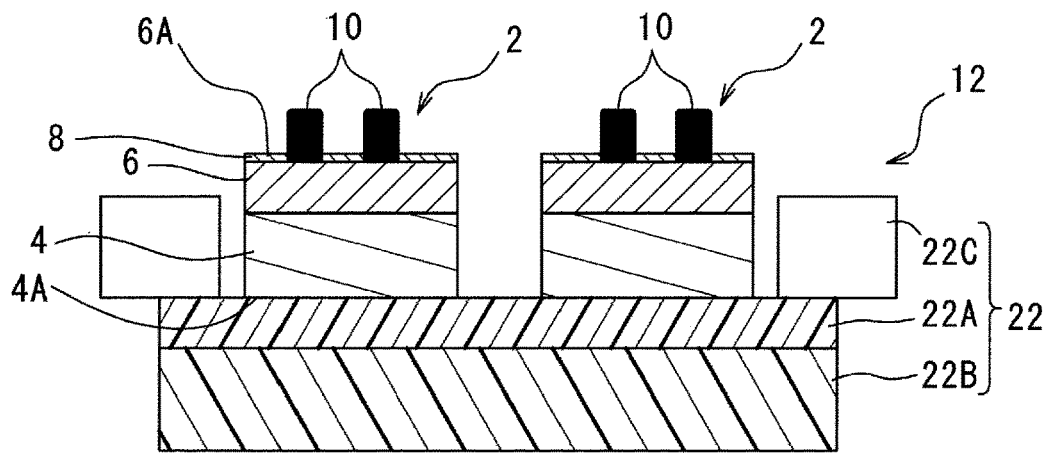
FIG. 7E is a cross-sectional view showing a mask removing step in the method for manufacturing an element chip according to the third embodiment.

In the mask removing step shown in FIG. 7E, the adhesive tape 24 and the resin 23 as a mask is removed from the front surface 6A of the semiconductor chip 2. In the present embodiment, since both the adhesive tape 24 and the resin 23 have water solubility, they are removed together by water washing. As the material of the water-soluble adhesive tape 24 and resin 23, a synthetic resin containing polyvinyl alcohol, oxazole and lithium styrenesulfonate, polyester or the like can be used.

In addition, even when only the resin 23 has water solubility and the adhesive tape 24 is water-insoluble, they can be removed by water washing. In a state where the water-insoluble adhesive tape 24 sticks to the semiconductor wafer 12 via the water-soluble resin 23, when the resin 23 is removed by water washing, the adhesive tape 24 can be removed together with the resin 23 by water washing.

In addition, when both the adhesive tape 24 and the resin 23 are water-insoluble, the adhesive tape 24 and the resin 23 may be removed by ashing in place of water washing. Specifically, a gas type different from that in the plasma etching in the dicing step may be used, an adhesive tape 24 and a resin 23 reacting to the gas type may be used, and the adhesive tape 24 and the resin 23 may be removed together by etching. Alternatively, the adhesive tape 24 and the resin 23 may be mechanically peeled off, but since it takes time to peel off the adhesive tape 24 one by one from each of the diced semiconductor chips 2, it is preferable that the adhesive tape 24 and the resin 23 can be removed together by ashing as described above.

In this way, the semiconductor chip 2 is manufactured through the steps in FIGS. 1A to 1F and FIGS. 7A to 7E.

Figure 10:
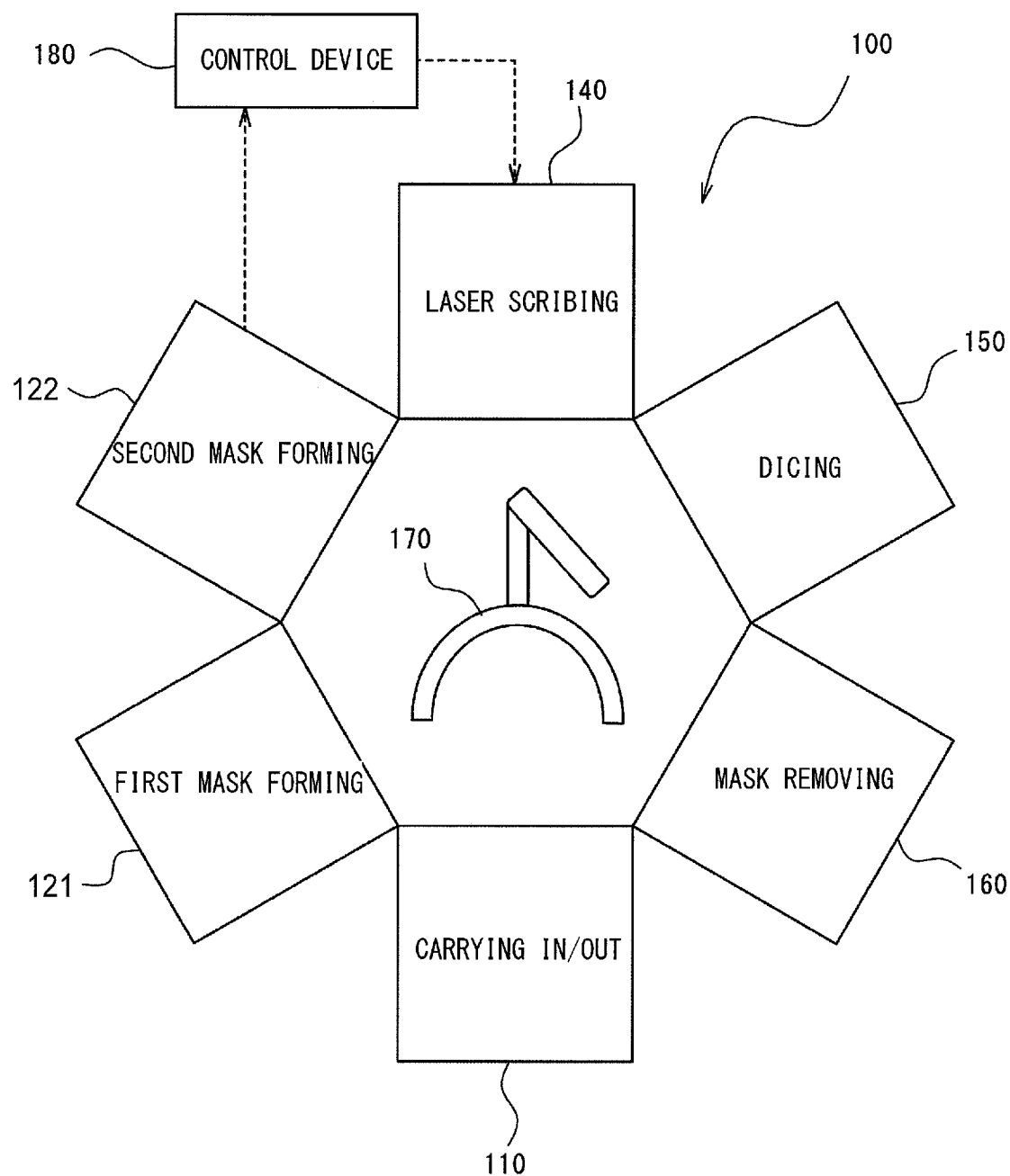
FIG. 10 is a schematic configuration diagram of an element chip manufacturing apparatus.

FIG. 10 shows a manufacturing apparatus 100 of a semiconductor chip (element chip) for executing the above series of steps. The manufacturing apparatus 100 includes a carrying in/out unit 110, a first mask forming unit 121, a second mask forming unit 122, a laser scribing unit 140, a dicing unit 150, a mask removing unit 160, a conveying mechanism 170, and a control device 180. The conveyance of the semiconductor wafer 12 between the respective units 110 to 160 is performed by the conveying mechanism 170.

The semiconductor wafer 12 having gone through the first preparation step, the second preparation step, the protection step, the thinning step, the first holding step, and the second holding step is carried in the carrying in/out unit 110. The carried-in semiconductor wafer 12 is conveyed to the first mask forming unit 121, and a mask forming step is executed. Next, the semiconductor wafer 12 is conveyed to the second mask forming unit 122, and a second mask forming step is executed. Next, the semiconductor wafer 12 is conveyed to the laser scribing unit 140, and the laser scribing step is executed. Next, the semiconductor wafer 12 is conveyed to the dicing unit 150, and the dicing step is executed. Next, the semiconductor wafer 12 is conveyed to the mask removing unit 160, and the mask removing step is executed. Then, after all these steps are completed, the semiconductor wafer 12 is taken out from the carrying in/out unit 110 as the semiconductor chip 2.

According to the present embodiment, applying the resin 23 to the dividing region 16 before laser scribing is performed allows the level difference between the element region 14 and the dividing region 16 to be reduced. In the semiconductor wafer 12, since the height of the dividing region 16 is smaller than the height of the element region 14, filling the dividing region 16 having a smaller height with the resin 23 reduces the level difference. Reducing the level difference allows the area where the adhesive tape 24 is in close contact with the semiconductor wafer 12 when the adhesive tape 24 is stuck to the semiconductor wafer 12 to be increased. As a result, since the adhesive tape 24 can be laser scribed in a state of being in close contact with the semiconductor wafer 12, debris can be prevented from sticking to the front surface 6A of the semiconductor wafer 12.

In addition, according to the present embodiment, since both the resin 23 and the adhesive tape 24 are water-soluble, even when the adhesive tape 24 and the resin 23 are thick, the adhesive tape 24 and the resin 23 can be easily removed by water washing after the dicing step.

Fourth Embodiment

FIGS. 11A to 11F show respective manufacturing steps in a method for manufacturing a semiconductor chip (element chip) 2 according to the fourth embodiment. FIGS. 11A to 11F respectively show a first mask forming step, a second mask forming step, a third mask forming step, a laser scribing step, a dicing step, and a mask removing step. It should be noted that the first preparation step, the second preparation step, the protection step, the thinning step, the first holding step, and the second holding step in the third embodiment are also executed in the present embodiment as in the third embodiment, but since the contents are the same, the description thereof will be omitted. In addition, also in the first mask forming step, the second mask forming step, the third mask forming step, the laser scribing step, the dicing step, and the mask removing step, descriptions of the same contents as those in the third embodiment may be omitted.

Figure 11A:
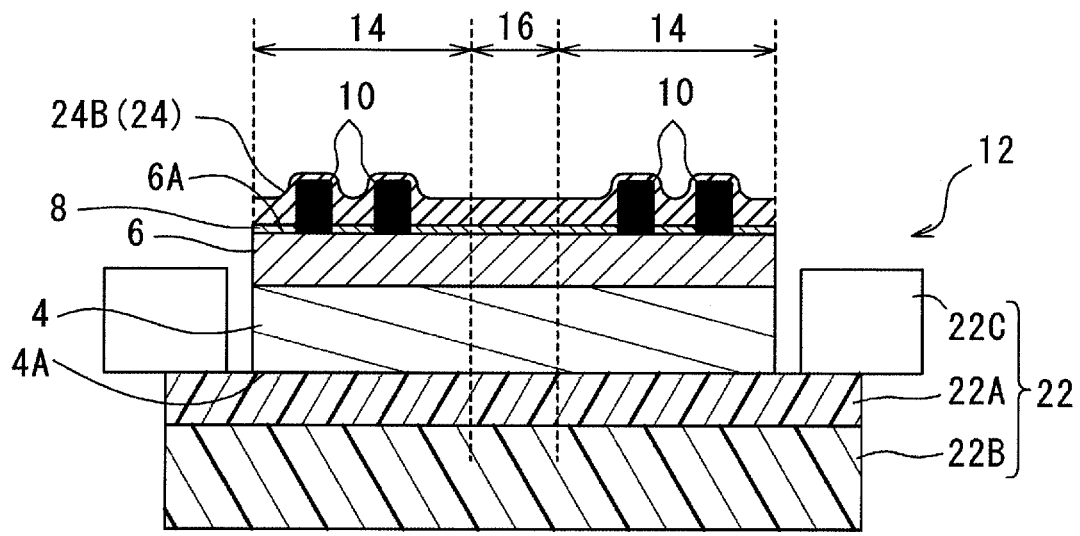
FIG. 11A is a cross-sectional view showing a first mask forming step in a method for manufacturing an element chip according to a fourth embodiment.

In the first mask forming step shown in FIG. 11A, a water-soluble resin 23 is applied onto the front surface of a semiconductor wafer 12. The resin 23 is applied to reduce the level difference on the front surface of the semiconductor wafer 12. Preferably, the material of the resin 23 has high adhesion to an adhesive layer 24B described below. Specifically, the adhesive strength between the resin 23 and the adhesive layer 24B is preferably higher than the adhesive strength between a base material layer 24A described below and the adhesive layer 24B.

Figure 11B:
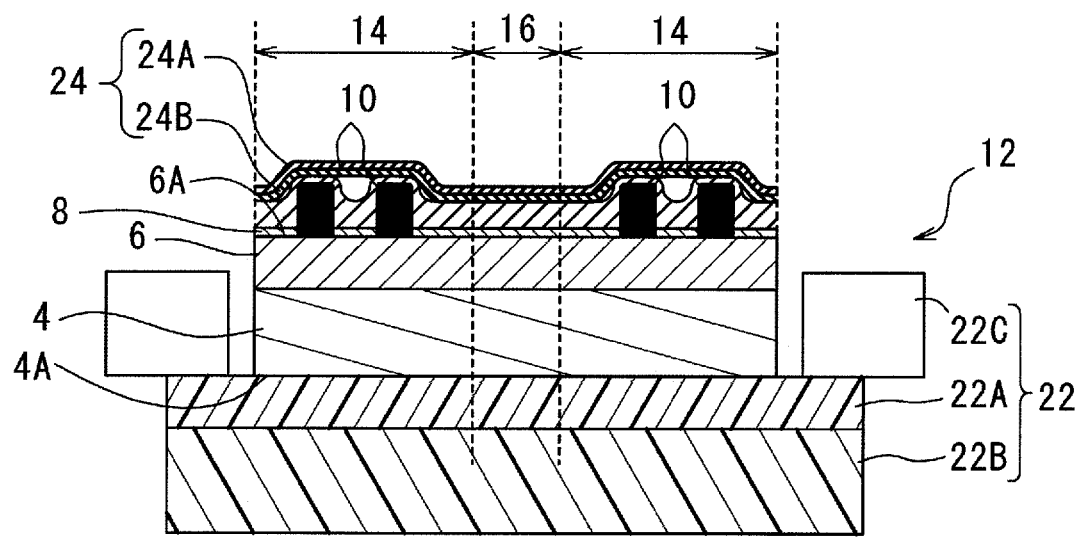
FIG. 11B is a cross-sectional view showing a second mask forming step in the method for manufacturing an element chip according to the fourth embodiment.

In the second mask forming step shown in FIG. 11B, an adhesive tape 24 is stuck to a front surface 6A of the semiconductor wafer 12. The thickness of the adhesive tape 24 is about 5 to 50 μm, and in the present embodiment, for example, 20 μm. The adhesive tape 24 has a two-layer structure including the base material layer 24A as a base and the adhesive layer 24B to be stuck to the semiconductor wafer 12. In the two-layer structure, the base material layer 24A can be easily peeled from the adhesive layer 24B.

Figure 11C:
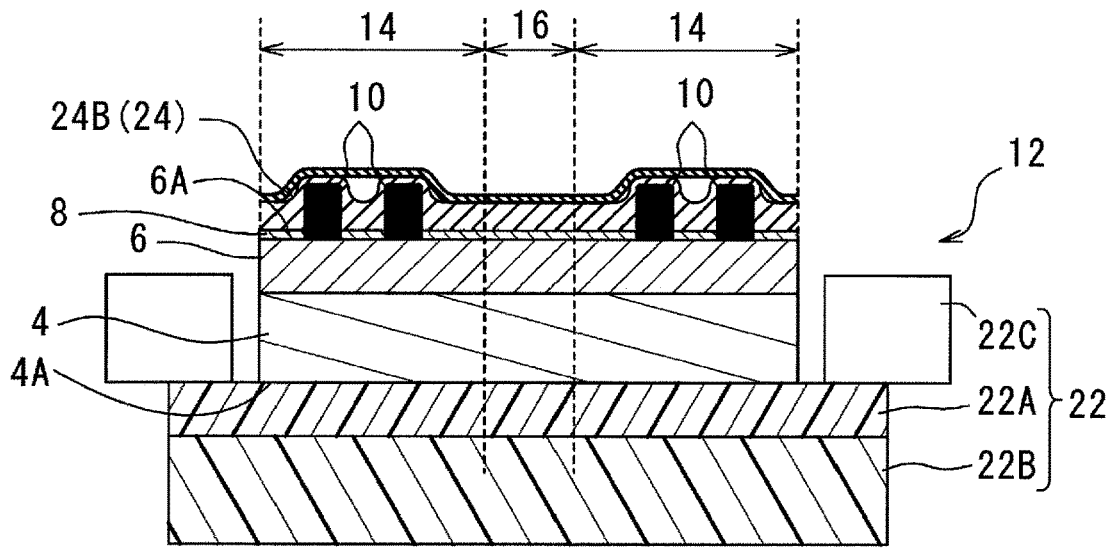
FIG. 11C is a cross-sectional view showing a third mask forming step in the method for manufacturing an element chip according to the fourth embodiment.

In the third mask forming step shown in FIG. 11C, the base material layer 24A of the adhesive tape 24 is peeled off. Specifically, only the base material layer 24A is removed with the adhesive layer 24B left. At this time, the higher the adhesive strength between the resin 23 and the adhesive layer 24B is than the adhesive strength between the base material layer 24A and the adhesive layer 24B, the more easily the base material layer 24A can be peeled from the adhesive layer 24B with the adhesive layer 24B left on the semiconductor wafer 12. Hereinafter, the remaining adhesive layer 24B is simply referred to as an adhesive tape 24. In the present embodiment, the adhesive layer 24B has water solubility and plasma resistance. Therefore, the portion to which the adhesive layer 24B is stuck of the semiconductor wafer 12 is protected from the subsequent plasma etching. That is, the adhesive layer 24B functions as a mask against the plasma. It should be noted that since the base material layer 24A of the adhesive tape 24 is removed in the present step, the material is not particularly limited, and any material can be used.

Figure 11D:
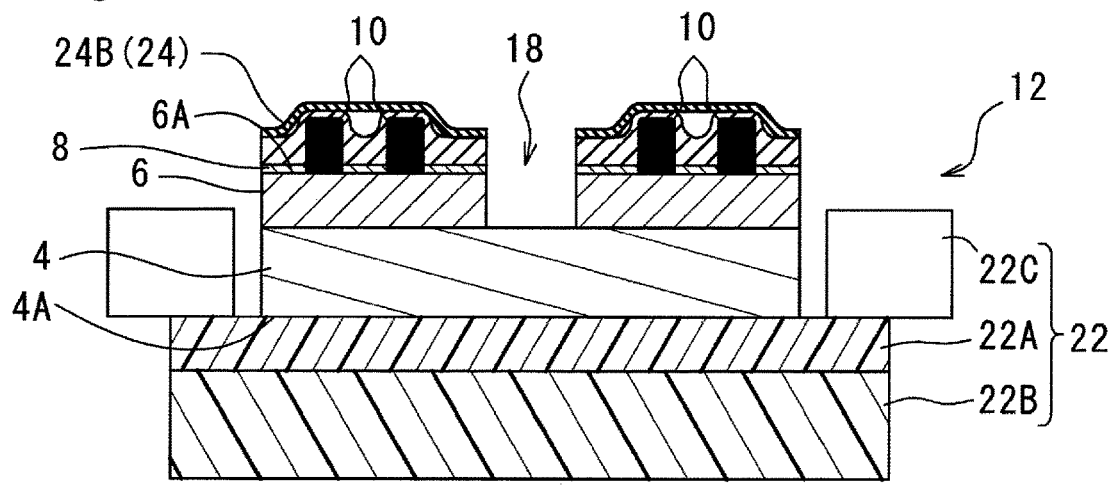
FIG. 11D is a cross-sectional view showing a laser scribing step in the method for manufacturing an element chip according to the fourth embodiment.
Figure 11E:
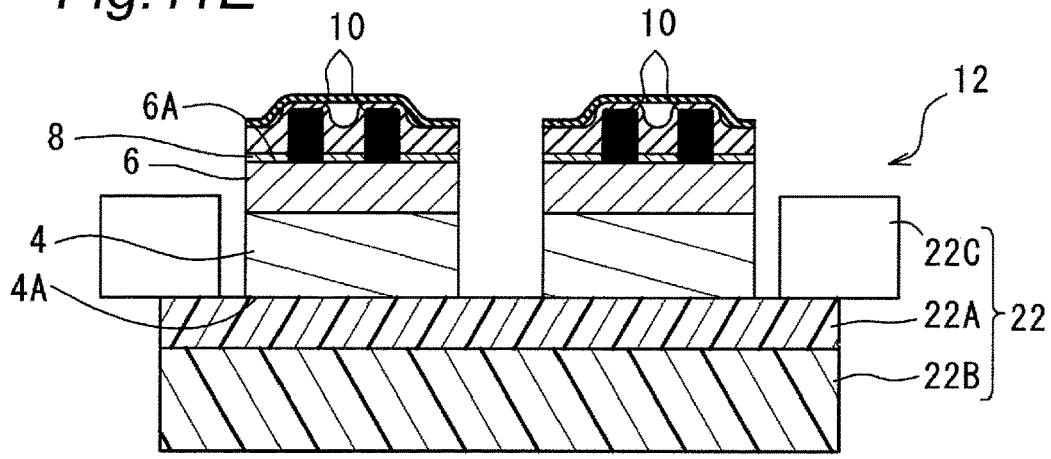
FIG. 11E is a cross-sectional view showing a dicing step in the method for manufacturing an element chip according to the fourth embodiment.
Figure 11F:
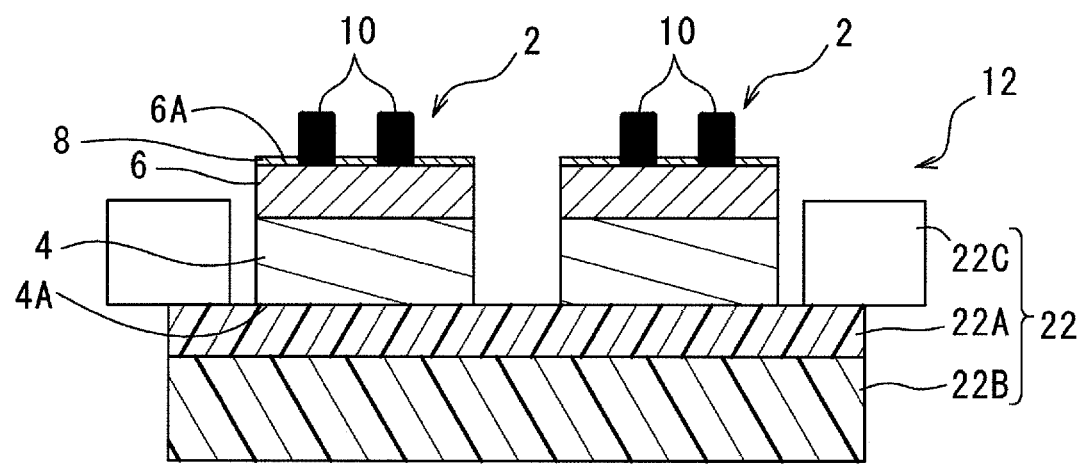
FIG. 11F is a cross-sectional view showing a mask removing step in the method for manufacturing an element chip according to the fourth embodiment.

The laser scribing step shown in FIG. 11D, the dicing step shown in FIG. 11E, and the mask removing step shown in FIG. 11F are the same as those in the third embodiment except that only the adhesive layer 24B is used as the adhesive tape 24.

The method for manufacturing an element chip according to the present embodiment is performed by the same manufacturing apparatus 100 as that of the third embodiment (see FIG. 10). However, the treatment differs from that of the third embodiment in that both the second mask forming step and the third mask forming step are executed in a second mask forming unit 122.

According to the present embodiment, in and after the second mask forming step, the adhesive tape 24 changes to only the adhesive layer 24B. Therefore, as compared with the third embodiment, since only the adhesive layer 24B only has to be removed in the mask removing step, the treatment is simpler than that of the third embodiment, and the adhesive tape 24 can be prevented from remaining.

REFERENCE SIGNS LIST 2 semiconductor chip (element chip)
4 semiconductor layer
4A back surface (second surface)
6 wiring layer
6A front surface (first surface)
8 protective film
10 bump
12 semiconductor wafer (substrate)
14 element region
14A first close contact portion
14B seal ring
16 dividing region
16A second close contact portion
18 exposed portion
20 BG tape
20A adhesive layer
20B base material layer
22 dicing tape (holding member)
22A adhesive layer
22B base material layer
22C frame
23 resin
24 adhesive tape
24A base material layer
24B adhesive layer
50 dry etching apparatus
52 chamber
54 antenna
56 first high frequency power supply unit
58 treatment chamber
60 stage
62 second high frequency power supply unit
64 gas inlet
66 etching gas source
68 exhaust port
70 vacuum exhaust unit
100 manufacturing apparatus of semiconductor chip (element chip)
110 carrying in/out unit
120 mask forming unit
121 first mask forming unit
122 second mask forming unit
130 measuring unit
131 camera
140 laser scribing unit
150 dicing unit
160 mask removing unit
170 conveying mechanism
180 control device

What is claimed is:

1. A method for manufacturing an element chip, the method comprising:
    preparing a substrate including a first surface and a second surface on an opposite side of the first surface, the substrate including on the first surface
        a plurality of element regions each including an electrode, and
        a dividing region configured to define each of the plurality of element regions, the dividing region is lower in height than each of the element regions;
    sticking an adhesive tape having translucency to a side of the first surface of the electrode, and pressing the adhesive tape against the substrate to form
        a first close contact portion in which the substrate and the adhesive tape are in close contact with each other in each of the plurality of element regions, and
        a second close contact portion in which the substrate and the adhesive tape are in close contact with each other along the dividing region in the dividing region,
        wherein a height of a portion of the adhesive tape in the first close contact portion is greater than a height of a portion of the adhesive tape in the second close contact portion;
    measuring a position and a width of the second close contact portion in the dividing region;
    applying a laser beam having a beam diameter smaller than the width of the second close contact portion to the adhesive tape such that the laser beam does not protrude from the second close contact portion based on the width of the second close contact portion and the beam diameter, and forming an exposed portion configured to expose the dividing region of the substrate to the adhesive tape;

exposing the first surface of the substrate to plasma with the second surface of the substrate held by a holding member, and while protecting each of the plurality of element regions from the plasma with the adhesive tape, etching the dividing region exposed in the exposed portion until the second surface is reached to dice the substrate into a plurality of element chips; and removing the adhesive tape remaining on the first surface of the substrate diced.

2. The method for manufacturing an element chip according to claim 1, further comprising:

determining whether to perform the applying of the laser beam, wherein the applying of the laser beam is performed when the width of the second close contact portion is larger than the beam diameter of the laser beam, and the applying of the laser beam is not performed when the width of the second close contact portion is equal to the beam diameter or smaller than the beam diameter of the laser beam.

3. A method for manufacturing an element chip, the method comprising:

preparing a substrate including a first surface and a second surface on an opposite side of the first surface, the substrate including on the first surface a plurality of element regions each including an electrode, and a dividing region configured to define each of the plurality of element regions, the dividing region having a height smaller than a height of each of the element regions;

applying a resin to the dividing region on a side of the first surface of the substrate to reduce a level difference between each of the plurality of element regions and the dividing region;

sticking an adhesive tape to the resin at the side of the first surface of the substrate such that a height of a portion of the adhesive tape above the electrode is greater than a height of a portion of the adhesive tape in the dividing region;

applying a laser beam to the dividing region, and forming an exposed portion configured to expose the dividing region of the substrate to the adhesive tape;

exposing the first surface of the substrate to plasma with the second surface of the substrate held by a holding member, and while protecting each of the plurality of element regions from the plasma with the adhesive tape, etching the dividing region exposed in the exposed portion until the second surface is reached to dice the substrate into a plurality of element chips; and removing the adhesive tape remaining on the first surface of the substrate diced.

4. The method for manufacturing an element chip according to claim 1, wherein in the sticking and pressing steps, a gap in which the adhesive tape is in contact with neither the electrode nor the substrate is formed between the first close contact portion and the second close contact portion and wherein in the applying step, the laser beam does not reach the gap.

* * * * *